United States Patent
Kim et al.

(10) Patent No.: US 12,407,547 B2
(45) Date of Patent: Sep. 2, 2025

(54) ADAPTIVE FILTER CIRCUIT HAVING LOW COMPLEXITY AND FLEXIBLE STRUCTURE AND DEVICE INCLUDING THE SAME

(71) Applicant: SAMSUNG ELECTRONICS CO., LTD., Suwon-si (KR)

(72) Inventors: Joontae Kim, Suwon-si (KR); Daeyoung Kim, Suwon-si (KR); Hyunseok Yu, Suwon-si (KR); Youngik Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/416,556

(22) Filed: Jan. 18, 2024

(65) Prior Publication Data

US 2024/0250854 A1   Jul. 25, 2024

(30) Foreign Application Priority Data

Jan. 19, 2023   (KR) .................. 10-2023-0008342
Jul. 28, 2023   (KR) .................. 10-2023-0098943

(51) Int. Cl.
*H04L 25/03* (2006.01)
*H04L 25/02* (2006.01)

(52) U.S. Cl.
CPC .... *H04L 25/03057* (2013.01); *H04L 25/0244* (2013.01); *H04L 2025/03605* (2013.01)

(58) Field of Classification Search
CPC .......... H04L 25/03057; H04L 25/0244; H04L 2025/03605
See application file for complete search history.

(56) References Cited

U.S. PATENT DOCUMENTS

| | | | |
|---|---|---|---|
| 6,754,340 B1 | 6/2004 | Ding | |
| 7,133,886 B2 | 11/2006 | Jin et al. | |
| 7,352,858 B2 | 4/2008 | Stokes et al. | |
| 7,734,466 B2 | 6/2010 | Barron et al. | |
| 9,923,592 B2 | 3/2018 | Choi | |
| 9,935,615 B2 | 4/2018 | Sheikh et al. | |
| 10,193,683 B2 | 1/2019 | Chen et al. | |
| 2004/0122882 A1 | 6/2004 | Zakharov et al. | |

(Continued)

FOREIGN PATENT DOCUMENTS

| | | |
|---|---|---|
| EP | 3 273 606 A1 | 1/2018 |
| WO | 2009/050434 A2 | 4/2009 |

OTHER PUBLICATIONS

Extended European Search Report dated Jul. 3, 2024, issued by the European Patent Office in European Application No. 24152657.3.

(Continued)

*Primary Examiner* — Janice N Tieu

(74) *Attorney, Agent, or Firm* — Sughrue Mion, PLLC

(57) ABSTRACT

An adaptive filter circuit includes a plurality of filter cores associated with each other and configured to perform a calculation operation on a first target input signal, and an auxiliary core configured to generate cross-terms between block correlation matrices respectively corresponding to kernels that correspond to the first target input signal and provide the cross-terms to the plurality of filter cores, where the plurality of filter cores are further configured to estimate effective channels respectively corresponding to the kernels based on the cross-terms.

20 Claims, 20 Drawing Sheets

(56) References Cited

U.S. PATENT DOCUMENTS

2016/0072592 A1   3/2016  Tu et al.
2017/0085252 A1*  3/2017  Sheikh .................... G06F 17/16
2020/0091995 A1*  3/2020  Axmon ................ H04W 84/06

OTHER PUBLICATIONS

Motz et al., "A Survey on Self-Interference Cancellation in Mobile LTE-A/5G FDD Transceivers" IEEE Transactions on Circuits and Systems-II: Express Briefs. vol. 68, No. 3, Mar. 2021, pp. 823-829 (7 pages total).

Zakharov et al., "Low-Complexity RLS Algorithms Using Dichotomous Coordinate Descent Iterations" IEEE Transactions on Signal Processing, vol. 56, No. 7, Jul. 2008 (12 Pages).

Kim et al., "A Delay Relaxed RLS-DCD Algorithm for Real-Time Implementation" IEEE, 2016 (5 Pages).

* cited by examiner

ADAPTIVE FILTER CIRCUIT HAVING LOW COMPLEXITY AND FLEXIBLE STRUCTURE AND DEVICE INCLUDING THE SAME

CROSS-REFERENCE TO RELATED APPLICATIONS

This application is based on and claims priority Korean Patent Application No. 10-2023-0098943, filed on Jul. 28, 2023, in the Korean Intellectual Property Office, and Korean Patent Application No. 10-2023-0008342, filed on Jan. 19, 2023, in the Korean Intellectual Property Office, the disclosures of which are incorporated by reference herein in their entirety.

BACKGROUND

Example embodiments of the disclosure relate to an adaptive filter circuit, and more particularly, to an adaptive filter circuit, which estimates an effective channel for an input signal, and a device including the adaptive filter circuit.

An adaptive filter is a system including a transfer function, which is controlled by variable parameters, and may be operated to adjust those parameters according to an optimization algorithm. When some parameters of an intended processing operation are not known in advance or are variable, adaptive filters may be used in some applications.

Adaptive filters may include recursive least squares (RLS) filters, least mean squares (LMS) filters, and the like. Because RLS filters perform calculations using correlation matrices, RLS filters may have a higher convergence speed than LMS filters and the like.

Performing calculations using block correlation matrices having increased dimensions have been proposed to improve the performance of RLS filters. However, because RLS filters require an operation of inversion of block correlation matrices, these proposals may drastically increase the complexity of RLS filters.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided are an adaptive filter circuit having low complexity and a flexible structure to effectively perform operations on block matrices with increased dimensions, and a device including the adaptive filter circuit.

Additional aspects will be set forth in part in the description which follows and, in part, will be apparent from the description, or may be learned by practice of the presented embodiments.

According to an aspect of an example embodiment, an adaptive filter circuit may include a plurality of filter cores associated with each other and configured to perform a calculation operation on a first target input signal, and an auxiliary core configured to generate cross-terms between block correlation matrices respectively corresponding to kernels that correspond to the first target input signal and provide the cross-terms to the plurality of filter cores, where the plurality of filter cores are further configured to estimate effective channels respectively corresponding to the kernels based on the cross-terms.

According to an aspect of an example embodiment, a method of operating an adaptive filter circuit including a first filter core, a second filter core, and an auxiliary core, may include receiving a first target input signal from a first signal route, generating, by the auxiliary core, a first cross-term and a second cross-term between a first block correlation matrix corresponding to a first kernel and a second block correlation matrix corresponding to a second kernel, estimating, by the first filter core, a first effective channel of the first target input signal and corresponding to the first kernel by subtracting the second cross-term from a first input vector corresponding to the first target input signal, and estimating, by the second filter core, a second effective channel of the first target input signal and corresponding to the second kernel by subtracting the first cross-term from a second input vector corresponding to the first target input signal.

According to an aspect of an example embodiment, a wireless communication device may include a transceiver including a plurality of transmission chains and a plurality of reception chains, an adaptive filter circuit including filter cores and an auxiliary core configured to remove interference due to at least one of the plurality of transmission chains from a target input signal received through a signal route including at least one of the plurality of reception chains, and a baseband processor configured to process the target input signal from which the interference is removed by the adaptive filter circuit, where the auxiliary core is configured to generate cross-terms between block correlation matrices corresponding to kernels that correspond to characteristics of the signal route and the filter cores are configured to remove the interference from the target input signal by estimating effective channels corresponding to the kernels based on the cross-terms.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
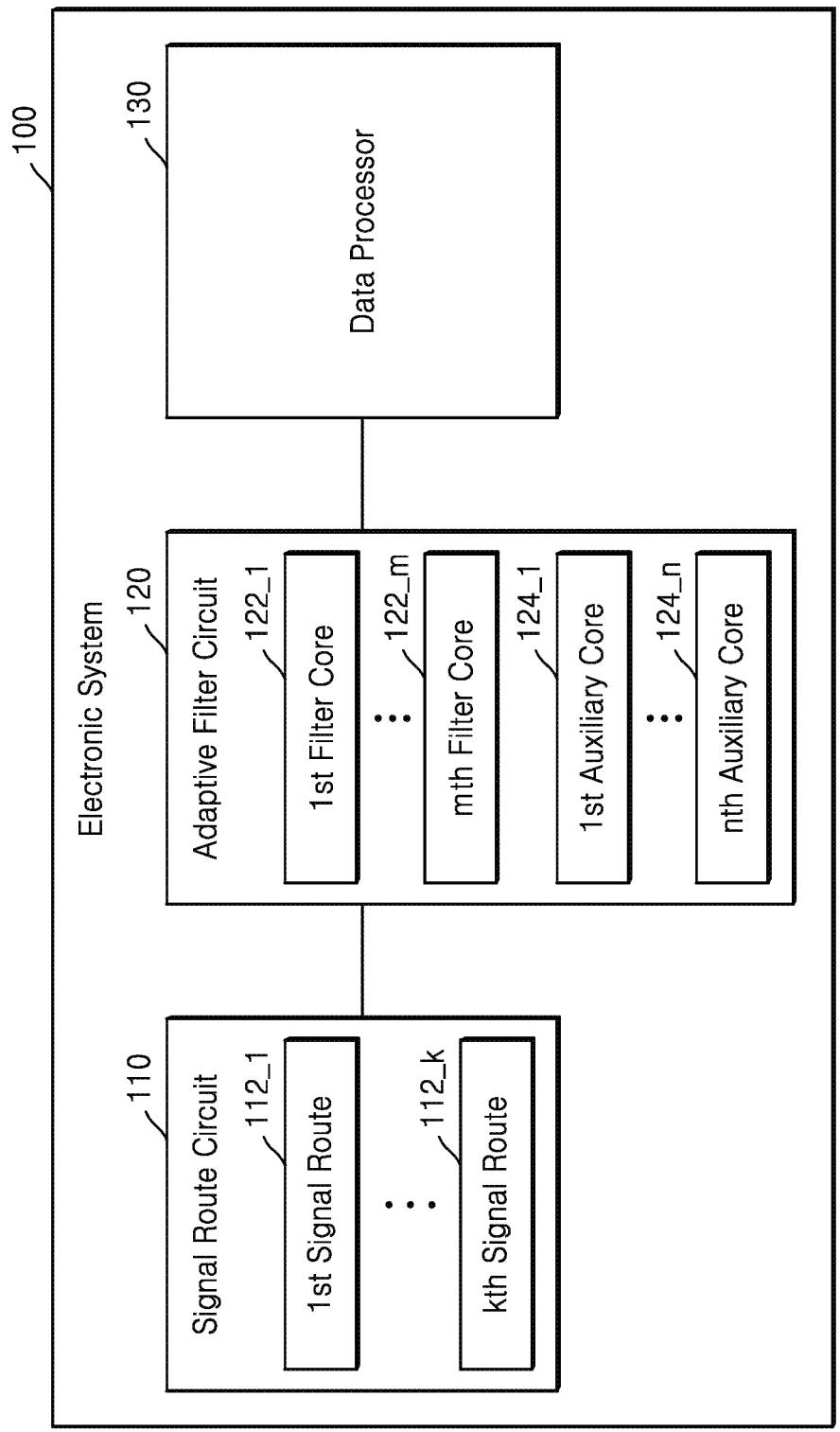
FIG. 1 is a block diagram schematically illustrating an electronic system according to one or more embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a block diagram illustrating an electronic system 100 according to one or more embodiments. The electronic system 100 may correspond to a device including an adaptive filter circuit 120 or may correspond to a system that identifies a target system by using the adaptive filter circuit 120 or performs modeling by using the adaptive filter circuit 120.

Referring to FIG. 1, the electronic system 100 may include a signal route circuit 110, the adaptive filter circuit 120, and a data processor 130. In some embodiments, at least one of the signal route circuit 110, the adaptive filter circuit 120, and the data processor 130 may be arranged outside the electronic system 100.

In an embodiment, the signal route circuit 110 may include first to k-th signal routes 112_1 to 112_k (where k is an integer of 1 or more). A signal route (that is, 112_1 to 112_k) may refer to a route through which signals are transferred or may be a route including at least one of delay circuits of a target system that is an identification target. Specific embodiments regarding signal routes (that is, 112_1 to 112_k), to which the disclosure is applied, are described below with reference to FIGS. 4A to 4D.

In an embodiment, the adaptive filter circuit 120 may include first to m-th filter cores 122_1 to 122_m (where m is an integer of 1 or more) and first to n-th auxiliary cores 124_1 to 124_n (where n is an integer of 1 or more). In an embodiment, each of the first to m-th filter cores 122_1 to 122_m may perform an adaptive filtering-based calculation operation on an input signal received from a signal route (that is, 112_1 to 112_k), alone or in association with another filter core. In an embodiment, each of the first to n-th auxiliary cores 124_1 to 124_n may perform a calculation operation for assisting with calculation operations of filter cores associated with each other from among the first to m-th filter cores 122_1 to 122_m.

In some embodiments, the adaptive filter circuit 120 may include at least two filter cores and at least one auxiliary core. The respective numbers of filter cores and auxiliary cores in the adaptive filter circuit 120 may vary depending on embodiments of the disclosure.

In an embodiment, the adaptive filter circuit 120 may receive an input signal from one of the first to k-th signal routes 112_1 to 112_k and may allocate at least one of the first to m-th filter cores 122_1 to 122_m and the first to n-th auxiliary cores 124_1 to 124_n to the received input signal for an adaptive filtering operation that is suitable for characteristics of the signal route. For example, for an adaptive filtering operation on a first input signal received from the first signal route 112_1, the adaptive filter circuit 120 may allocate the first and second filter cores 122_1 and 122_2 and the first auxiliary core 124_1. In addition, for an adaptive filtering operation on a second input signal received from the second signal route 112_2, the adaptive filter circuit 120 may allocate the first filter core 122_1.

In an embodiment, each of the first to n-th auxiliary cores 124_1 to 124_n may have a hardware size that is less than that of each of the first to m-th filter cores 122_1 to 122_m, and thus, may have a relatively lower power consumption than each of the first to m-th filter cores 122_1 to 122_m. However, this is only an example, and an implementation example of an auxiliary core (that is, 124_1 to 124_n) is not limited thereto.

In an embodiment, the adaptive filter circuit 120 may provide an adaptive filtering result to the data processor 130. The data processor 130 may perform an operation of data analysis or data processing using the adaptive filtering result. Specific embodiments of this are described below with reference to FIGS. 4A to 4D.

Figure 2A:
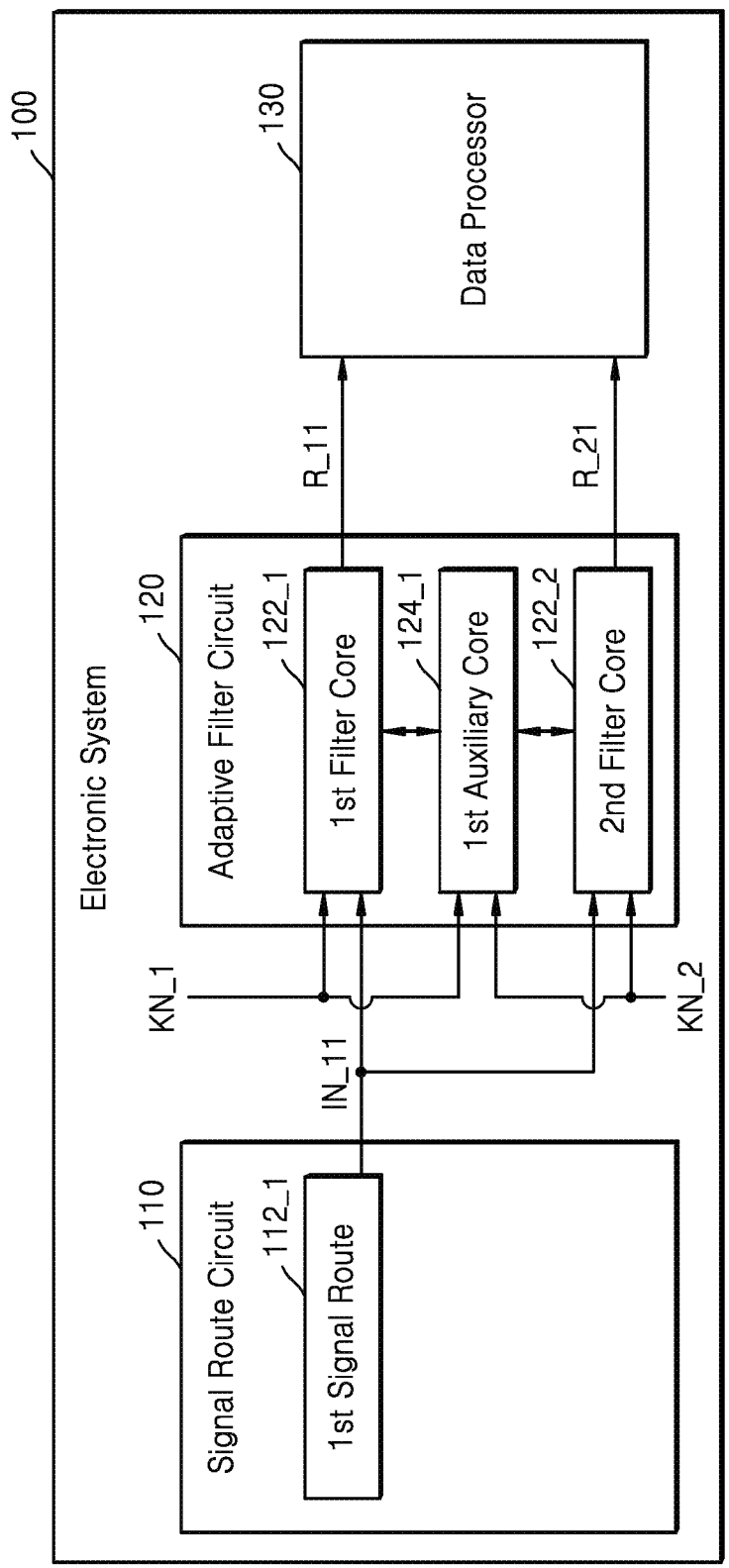
FIGS. 2A and 2B are block diagrams illustrating operations of an adaptive filter circuit of FIG. 1 according to one or more embodiments.
Figure 2B:
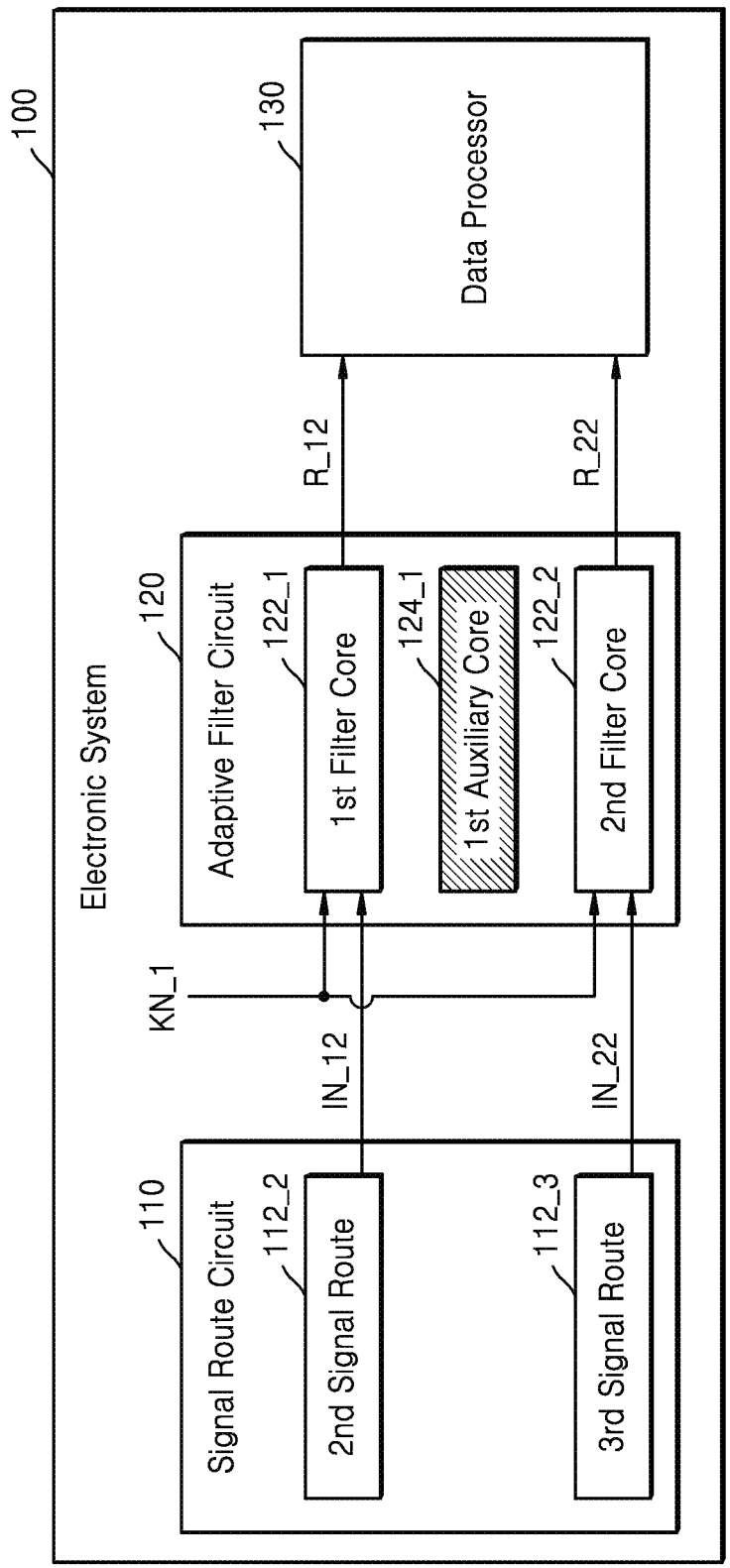
Figure 2C:
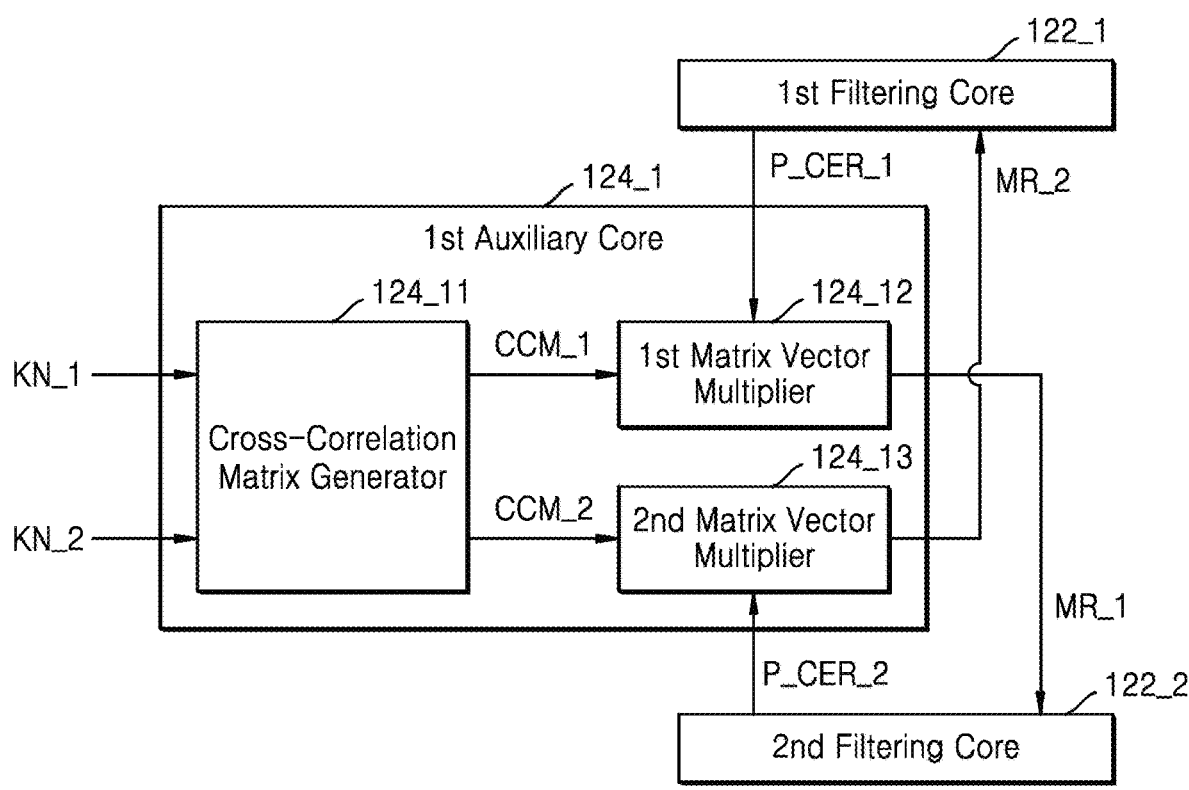
FIG. 2C is a block diagram illustrating operations of a first auxiliary core of FIG. 2A according to one or more embodiments.

FIGS. 2A and 2B are each a block diagram specifically illustrating operations of the adaptive filter circuit 120 of FIG. 1 according to one or more embodiments. FIG. 2C is a block diagram illustrating operations of the first auxiliary core 124_1 of FIG. 2A according to one or more embodiments.

An embodiment of the adaptive filter circuit 120, which performs an adaptive filtering operation on a first input signal IN_11 received from the first signal route 112_1, is described with reference to FIG. 2A, and an embodiment of the adaptive filter circuit 120, which performs adaptive filtering operations on second and third input signals IN_12 and IN_22 respectively received from the second and third signal routes 112_2 and 112_3, is described with reference to FIG. 2B. Hereinafter, although embodiments in which a recursive least squares (RLS)-based algorithm is applied to the adaptive filter circuit 120 are mainly described, it will be understood that the disclosure is not limited to such embodiments.

Referring to FIG. 2A, for an adaptive filtering operation on the first input signal IN_11 received from the first signal route 112_1, the first filter core 122_1, the second filter core 122_2, and the first auxiliary core 124_1 of the adaptive filter circuit 120 may be allocated.

The first filter core 122_1 and the second filter core 122_2 may perform calculations regarding Equation (1).

$$Rh = y \qquad (1)$$

In Equation (1), R is a block correlation matrix having an N×N dimension corresponding to a kernel, and y is a cross-correlation vector (or an input vector) having an N×1 dimension and may correspond to a signal (for example, the first input signal IN_11) that is input to the adaptive filter circuit 120. In addition, h may be a matrix corresponding to an effective channel which an input signal undergoes. A kernel may be preset for an adaptive filtering operation to be suitable for characteristics of a signal route and may include information about block correlation matrices. For example, a first kernel KN_1 and a second kernel KN_2 may be set to correspond to characteristics of the first signal route 112_1, and the adaptive filter circuit 120 may use the first kernel KN_1 and the second kernel KN_2 when performing an adaptive filtering operation on the first input signal IN_11 of the first signal route 112_1.

Equation (1) may be rearranged into Equation (2).

$$\begin{bmatrix} R_{00} & R_{01} \\ R_{10} & R_{11} \end{bmatrix} \begin{bmatrix} h_0 \\ h_1 \end{bmatrix} = \begin{bmatrix} y_0 \\ y_1 \end{bmatrix} \quad (2)$$

In Equation (2), $R_{00}$ and $R_{10}$ are block correlation matrices corresponding to the first kernel KN_1 and $R_{11}$ and $R_{01}$ are block correlation matrices corresponding to the second kernel KN_2. In particular, $R_{10}$ may be a matrix generated by correlating $R_{00}$ with the second kernel KN_2, and $R_{01}$ may be a matrix generated by correlating $R_{11}$ with the first kernel KN_1. $y_0$ and $y_1$ are cross-correlation vectors (or input vectors) between vectors generated by the first input signal IN_11, the first kernel KN_1, and the second kernel KN_2. $R_{00}$ and $R_{11}$ may have a conjugate transpose relation with each other, and $R_{01}$ and $R_{10}$ may have a conjugate transpose relation with each other. $h_0$ is a matrix corresponding to an effective channel associated with the first kernel KN_1, and $h_1$ is a matrix corresponding to an effective channel associated with the second kernel KN_2.

The matrices in Equation (2) are block-level matrices, and because there is a need for calculations of inverting block-level matrices, it may be difficult to solve Equation (2) only with one filter core due to a limit in designing a filter core. Therefore, to solve Equation (2), the first filter core 122_1 and the second filter core 122_2 may collaborate with each other to perform calculations and the first auxiliary core 124_1 may perform auxiliary calculations to help the first filter core 122_1 and the second filter core 122_2.

According to some embodiments, Equation (2) may be rearranged into Equation (3) to reduce the complexity of calculation.

$$\begin{bmatrix} R_{00}(i)h_0(i) \\ R_{11}(i)h_1(i) \end{bmatrix} \cong \begin{bmatrix} y_0(i) \\ y_1(i) \end{bmatrix} - \begin{bmatrix} R_{01}(i)h_1(i-D) \\ R_{10}(i)h_0(i-D) \end{bmatrix} \quad (3)$$

In Equation (3), i denotes a time index, $h_0(i-D)$ denotes an estimation value (or a past channel estimation result) of an effective channel associated with the first kernel KN_1 that is earlier by as much as past D samples, and $h_1(i-D)$ denotes an estimation value (or a past channel estimation result) of an effective channel associated with the second kernel KN_1 that is earlier by as much as past D samples. $R_{01}(i)h_1(i-D)$, and $R_{10}(i)h_0(i-D)$ are cross-terms and may be calculated by the first auxiliary core 124_1. The first filter core 122_1 may subtract $R_{01}(i)h_1(i-D)$, which is a cross-term, from $y_0(i)$, which is an input vector, and thus may adjust the input vector. That is, the first filter core 122_1 may derive $h_0(i)$ as a first estimation value of the effective channel by solving the equation $R_{00}(i)h_0(i)=y_0(i)-R_{01}(i)h_1(i-D)$. In addition, the second filter core 122_2 may subtract $R_{10}(i)h_0(i-D)$, which is a cross-term, from $y_1(i)$, which is an input vector, and thus may adjust the input vector. That is, the second filter core 122_2 may derive $h_1(i)$ as a second estimation value of the effective channel by solving the equation $R_{11}(i)h_1(i)=y_1(i)-R_{10}(i)h_0(i-D)$.

In an embodiment, the first filter core 122_1 may generate a first filtering result R_11 for the first input signal IN_11, based on the first estimation value of the effective channel of the first input signal IN_11, and may provide the first filtering result R_11 to the data processor 130. For example, the first filtering result R_11 may include information related to the first kernel KN_1 to identify the first signal route 112_1 or may include the first input signal IN_11 from which interference related to the first kernel KN_1 in the first signal route 112_1 is removed.

In an embodiment, the second filter core 122_2 may generate a second filtering result R_21 for the first input signal IN_11, based on the second estimation value of the effective channel of the first input signal IN_11, and may provide the second filtering result R_21 to the data processor 130. For example, the second filtering result R_21 may include information related to the second kernel KN_2 to identify the first signal route 112_1 or may include the first input signal IN_11 from which interference related to the second kernel KN_2 in the first signal route 112_1 is removed.

In some embodiments, the adaptive filter circuit 120 may combine the first filtering result R_11 and the second filtering result R_21 into one filtering result and may provide the one filtering result to the data processor 130.

In an embodiment, the data processor 130 may perform data analysis or data processing based on the first and second filtering results R_11 and R_21.

Regarding FIG. 2A, although the embodiments have been described where Equation (3) may be solved by the first filter core 122_1 and the second filter core 122_2, these are only examples. The disclosure is not limited thereto and may also be applied to various RLS-related algorithms (for example, delayed relaxed RLS algorithms), thereby allowing calculations by the algorithms to be simplified.

The disclosure, which uses past channel estimation results to simplify calculations in an adaptive filtering operation, may be applied to various algorithms.

When performing an adaptive filtering operation on an input signal using a plurality of kernels, the adaptive filter circuit 120 according to an embodiment may simplify an equation of the adaptive filtering operation by allocating a plurality of filter cores and an auxiliary core to the adaptive filtering operation and thus may effectively perform the adaptive filtering operation on the input signal.

Referring further to FIG. 2B, the first filter core 122_1 may solely estimate an effective channel of the second input signal IN_12 received from the second signal route 112_2, using the first kernel KN_1. In addition, the second filter core 122_2 may solely estimate an effective channel of a third input signal IN_22 received from the third signal route 112_3, using the first kernel KN_1. The first kernel KN_1 may correspond to characteristics of each of the second signal route 112_2 and the third signal route 112_3.

In an embodiment, the first filter core 122_1 may generate a third filtering result R_12 for the second input signal IN_12, based on an estimation value of the effective channel of the second input signal IN_12, and may provide the third filtering result R_12 to the data processor 130.

In an embodiment, the second filter core 122_2 may generate a fourth filtering result R_22 for the third input signal IN_22, based on an estimation value of the effective channel of the third input signal IN_22, and may provide the fourth filtering result R_22 to the data processor 130.

As such, in an embodiment, when estimating an effective channel of an input signal (that is, IN_12 or IN_22) using one kernel (that is, KN_1), the adaptive filter circuit 120 may allocate one filter core (that is, 122_1 or 122_2). The adaptive filter circuit 120 may deactivate the first auxiliary core 124_1.

In an embodiment, the first filter core 122_1 and the second filter core 122_2 may collaborate with each other to perform an adaptive filtering operation or may each perform an adaptive filtering operation alone. In addition, when the first filter core 122_1 and the second filter core 122_2 collaborate with each other and thus perform an adaptive filtering operation, the first auxiliary core 124_1 may perform auxiliary calculations to help the first filter core 122_1 and the second filter core 122_2.

The adaptive filter circuit 120 according to an embodiment may provide high flexibility of operations by flexibly allocating at least one of an auxiliary core and filter cores to perform an adaptive filtering operation, depending on characteristics of a signal route.

Referring further to FIG. 2C, the first auxiliary core 124_1 may include a cross-correlation matrix generator 124_11, a first matrix vector multiplier 124_12, and a second matrix vector multiplier 124_13.

In an embodiment, the cross-correlation matrix generator 124_11 may receive the first kernel KN_1 and the second kernel KN_2 and may generate a first cross-block correlation matrix CCM_1 (for example, $R_{10}$ of Equation (2)) and a second cross-block correlation matrix CCM_2 (for example, $R_{01}$ of Equation (2)) based on a first block correlation matrix (for example, $R_{00}$ of Equation (2)), which corresponds to the first kernel KN_1, and a second block correlation matrix (for example, $R_{11}$ of Equation (2)), which corresponds to the second kernel KN_2.

In an embodiment, the first matrix vector multiplier 124_12 may receive a first past channel estimation result P_CER_1 (for example, $h_0(i-D)$ of Equation (3)) of the effective channel of the first input signal IN_11 (see FIG. 2A) from the first filter core 122_1. The first past channel estimation result P_CER_1 may have been generated in the past by the first filter core 122_1 based on Equation (3) and may be associated with the first kernel KN_1. The first matrix vector multiplier 124_12 may generate a first multiplication result MR_1 (for example, $R_{10}(i)h_0(i-D)$ of Equation (3)) by multiplying the first cross-block correlation matrix CCM_1 (for example, $R_{10}$ of Equation (2)) by the first past channel estimation result P_CER_1 (for example, $h_0(i-D)$ of Equation (3)) and may provide the first multiplication result MR_1 as a cross-term to the second filter core 122_2.

In an embodiment, the second matrix vector multiplier 124_13 may receive a second past channel estimation result P_CER_2 (for example, $h_1(i-D)$ of Equation (3)) of the effective channel of the first input signal IN_11 (see FIG. 2A) from the second filter core 122_2. The second past channel estimation result P_CER_2 may have been generated in the past by the second filter core 122_2 based on Equation (3) and may be associated with the second kernel KN_2. The second matrix vector multiplier 124_13 may generate a second multiplication result MR_2 (for example, $R_{01}(i)h_1(i-D)$ of Equation (3)) by multiplying the second cross-block correlation matrix CCM_2 (for example, $R_{01}$ of Equation (2)) by the second past channel estimation result P_CER_2 (for example, $h_1(i-D)$ of Equation (3)) and may provide the second multiplication result MR_2 as a cross-term to the first filter core 122_1.

In an embodiment, the first filter core 122_1 may derive $h_0(i)$ by solving the equation $R_{00}(i)h_0(i)=y_0(i)-R_{01}(i)h_1(i-D)$, to which the second multiplication result MR_2 is applied. The second filter core 122_2 may derive $h_1(i)$ by solving the equation $R_{11}(i)h_1(i)=y_1(i)-R_{10}(i)h_0(i-D)$, to which the first multiplication result MR_1 is applied.

However, because the implementation example of the first auxiliary core 124_1 of FIG. 2C is only an example, the first auxiliary core 124_1 is not limited thereto and may be variously implemented to be suitable to perform an auxiliary calculation. The implementation example of the first auxiliary core 124_1 of FIG. 2C may also be applied to the other auxiliary cores 124_2 to 124_n of FIG. 1.

Figure 3:
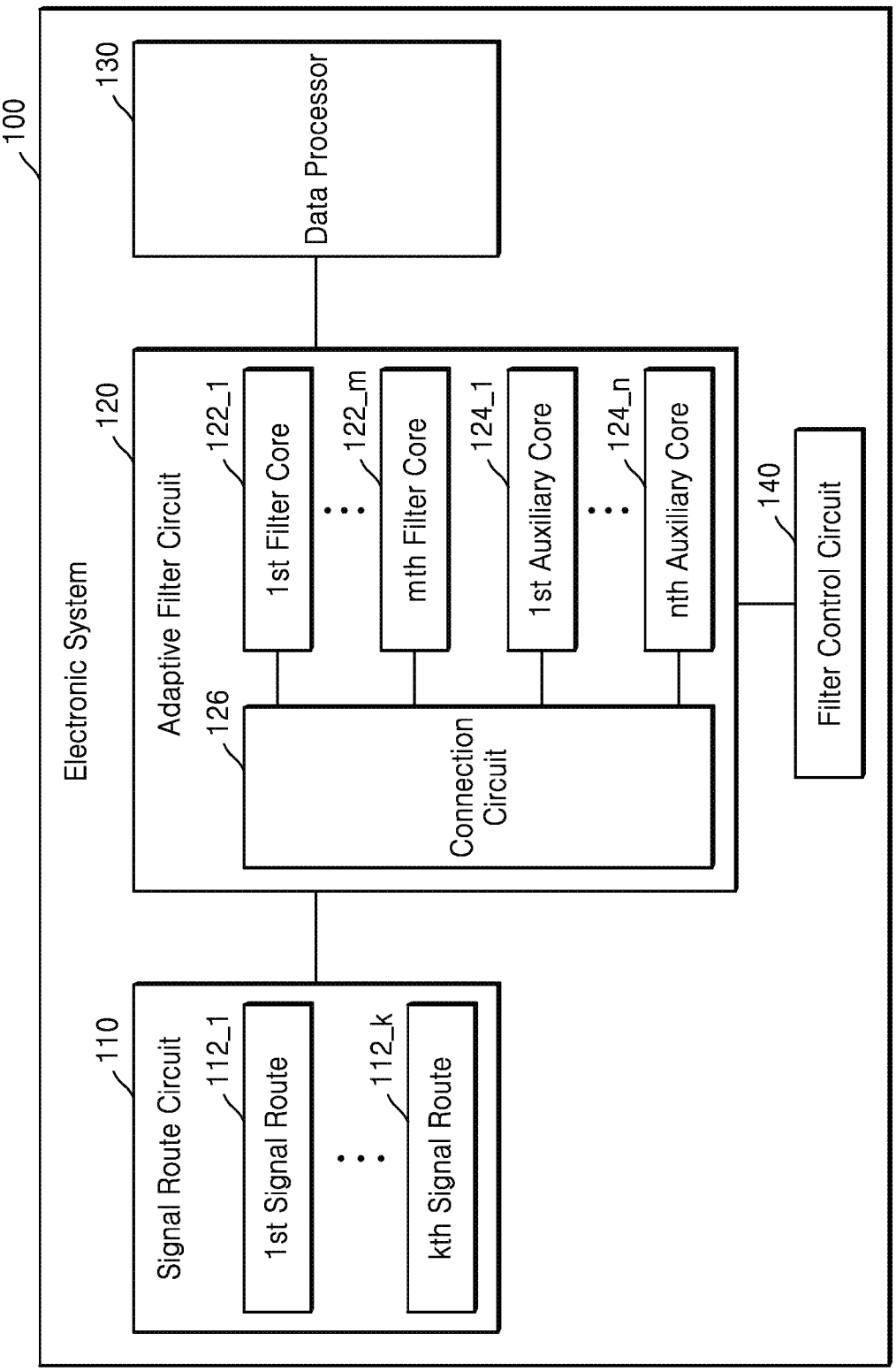
FIG. 3 is a block diagram illustrating an electronic system according to one or more embodiments.

FIG. 3 is a block diagram illustrating an electronic system according to one or more embodiments. Regarding FIG. 3, repeated descriptions given with reference to FIG. 1 may be omitted for convenience.

Referring to FIG. 3, the electronic system 100 may further include a filter control circuit 140, as compared with FIG. 1. In addition, the adaptive filter circuit 120 may further include a connection circuit 126, as compared with FIG. 1.

In an embodiment, the filter control circuit 140 may check characteristics of a target signal route from among the first to k-th signal routes 112_1 to 112_k and may control the adaptive filter circuit 120 based on a checked result. Specifically, when the characteristics of the target signal route indicate that an adaptive filtering operation using a plurality of kernels is required, the filter control circuit 140 may allocate a plurality of filter cores associated with each other from among the first to m-th filter cores 122_1 to 122_m and one of the first to n-th auxiliary cores 124_1 to 124_n for an adaptive filtering operation on a target input signal of the target signal route. The filter control circuit 140 may control the connection circuit 126 to connect the plurality of filter cores and the auxiliary core with each other based on the allocation result.

In some embodiments, the filter control circuit 140 may control the adaptive filter circuit 120 by additionally considering operation states of the first to m-th filter cores 122_1 to 122_m and the first to n-th auxiliary cores 124_1 to 124_n. Specifically, the filter control circuit 140 may allocate a filter core for the adaptive filtering operation on the target input signal from among filter cores in a deactivated state (or an idle state) in the first to m-th filter cores 122_1 to 122_m and may allocate an auxiliary core for the adaptive filtering operation on the target input signal from among auxiliary cores in a deactivated state (or an idle state) in the first to n-th auxiliary cores 124_1 to 124_n.

In an embodiment, information about the characteristics of the first to k-th signal routes 112_1 to 112_k may be stored in a memory, and the filter control circuit 140 may access the memory and refer to the stored information.

Although FIG. 3 illustrates that the adaptive filter circuit 120 and the filter control circuit 140 are separate components from each other, this is only an example, and the adaptive filter circuit 120 and the filter control circuit 140 are not limited thereto and may be integrated into one integrated circuit.

FIGS. 4A to 4D are diagrams respectively illustrating application examples of adaptive filter circuits 220_1 to 220_4 according to one or more embodiments.

Figure 4A:
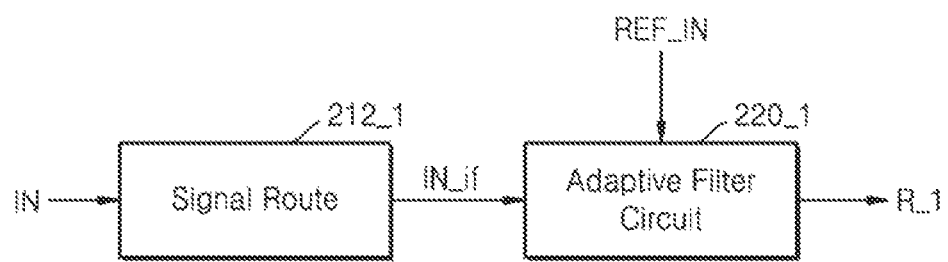
FIGS. 4A to 4D are diagrams respectively illustrating application examples of an adaptive filter circuit according to one or more embodiments.

Referring to FIG. 4A, the adaptive filter circuit 220_1 may remove interference from an input signal. An input signal IN may include interference due to a signal route 212_1 while passing through the signal route 212_1. The adaptive filter circuit 220_1 may perform an adaptive filtering operation on an input signal IN_if including interference, thereby removing the interference from the input signal IN_if. The adaptive filter circuit 220_1 may output the interference-removed input signal as a filtering result R_1.

In an embodiment, the adaptive filter circuit 220_1 may perform an adaptive filtering operation using at least one kernel corresponding to characteristics of the signal route 212_1. Specifically, the adaptive filter circuit 220_1 may allocate a plurality of filter cores and an auxiliary core for an adaptive filtering operation using a plurality of kernels.

In some embodiments, the adaptive filter circuit 220_1 may adjust coefficients of the adaptive filter circuit 220_1 or the at least one kernel corresponding to the characteristics of the signal route 212_1, by additionally receiving a reference signal REF_IN in a calibration period.

Figure 4B:
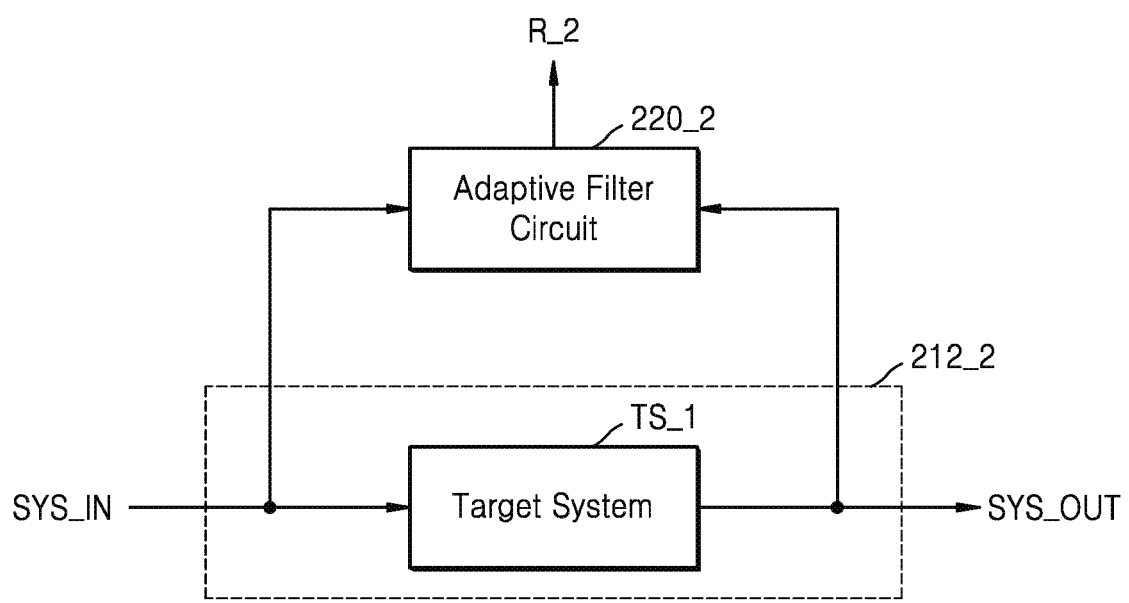

Referring further to FIG. 4B, the adaptive filter circuit 220_2 may perform an adaptive filtering operation for the identification of a target system TS_1. A signal route 212_2 may include the target system TS_1, and the adaptive filter circuit 220_2 may receive an input signal, which includes at least one of a system input SYS_IN and a system output SYS_OUT, from the signal route 212_2.

In an embodiment, the adaptive filter circuit 220_2 may estimate an effective channel related to the target system TS_1 using the input signal and at least one kernel that corresponds to characteristics of the signal route 212_2, and then, may output an estimation result as a filtering result R_2. The filtering result R_2 may be used for analysis for the identification of the target system TS_1.

Figure 4C:
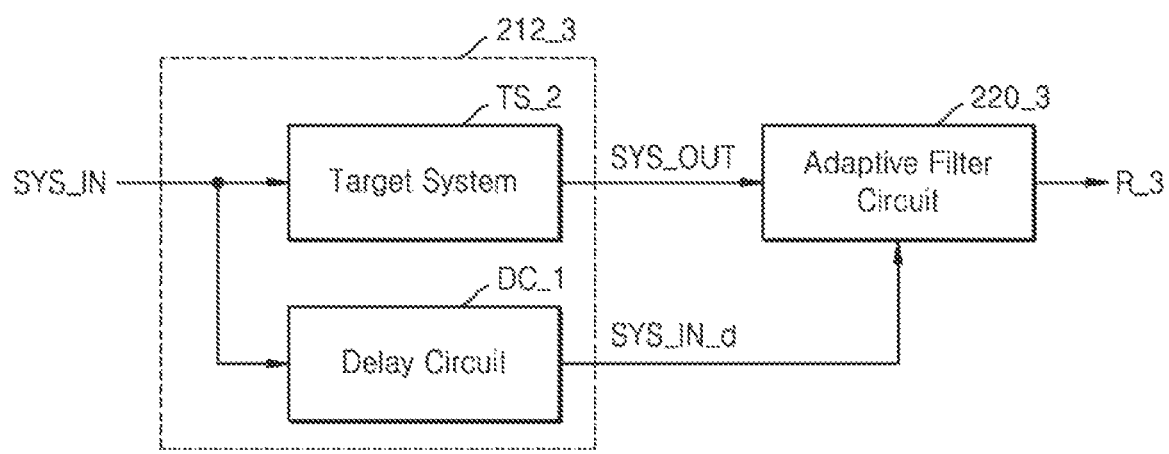

Referring further to FIG. 4C, the adaptive filter circuit 220_3 may perform an adaptive filtering operation for the inverse modeling of a target system TS_2. A signal route 212_3 may include the target system TS_2 and a delay circuit DC_1, and the adaptive filter circuit 220_3 may receive an input signal, which includes at least one of a system output SYS_OUT and a system delay input SYS_IN_d, from the signal route 212_3. The system output SYS_OUT may be a signal generated by passing the system input SYS_IN through the target system TS_2, and the system delay input SYS_IN_d may be a signal generated by passing the system input SYS_IN through the delay circuit DC_1.

In an embodiment, the adaptive filter circuit 220_3 may estimate an effective channel for the inverse modeling of the target system TS_2 using the input signal and at least one kernel that corresponds to characteristics of the signal route 212_3, and then, may output an estimation result as a filtering result R_3. The filtering result R_3 may be used for analysis for the inverse modeling of the target system TS_2.

Figure 4D:
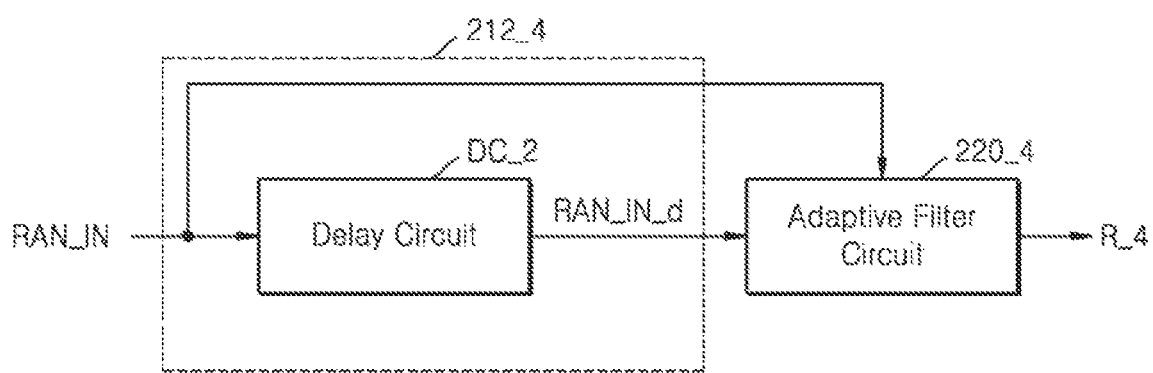

Referring further to FIG. 4D, the adaptive filter circuit 220_4 may perform an adaptive filtering operation for predictive modeling. A signal route 212_4 may include a delay circuit DC_2, and the adaptive filter circuit 220_4 may receive an input signal, which includes at least one of a random signal RAN_IN and a delayed random signal RAN_IN_d, from the signal route 212_4. The delayed random signal RAN_IN_d may be a signal generated by passing the random signal RAN_IN through the delay circuit DC_2.

In an embodiment, the adaptive filter circuit 220_4 may estimate an effective channel for the predictive modeling of the random signal RAN_IN using the input signal and at least one kernel that corresponds to characteristics of the signal route 212_4, and then, may output an estimation result as a filtering result R_4. The filtering result R_4 may be used for analysis for the predictive modeling of the random signal RAN_IN.

Figure 5:
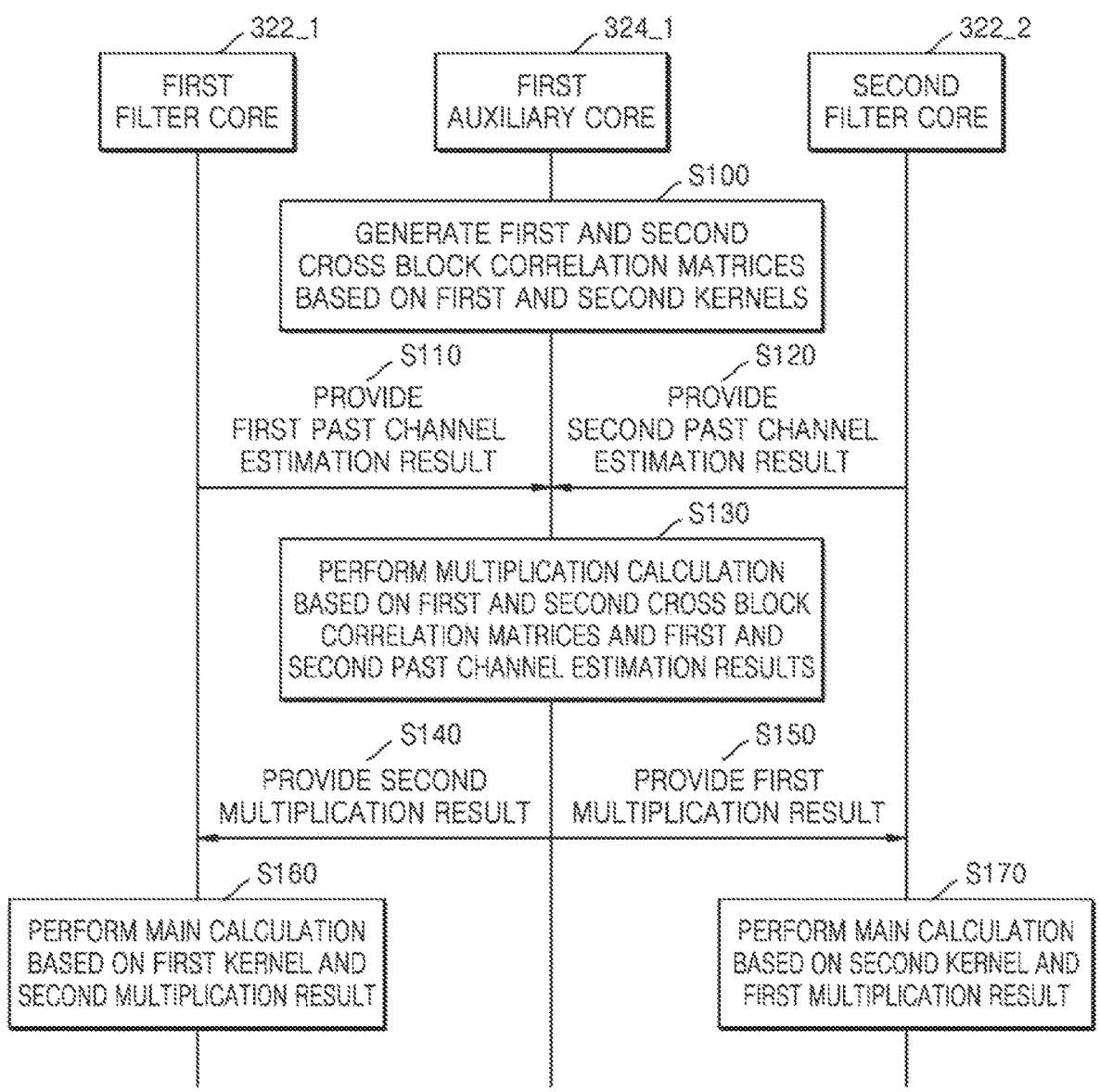
FIG. 5 is a flowchart illustrating a method of operating an adaptive filter circuit, according to one or more embodiments.

FIG. 5 is a flowchart illustrating a method of operating an adaptive filter circuit, according to one or more embodiments. The adaptive filter circuit may include a first filter core 322_1, a second filter core 322_2, and a first auxiliary core 324_1. In addition, the adaptive filter circuit may perform an adaptive filtering operation on an input signal from a signal route using first and second kernels.

Referring to FIG. 5, in operation S100, the first auxiliary core 324_1 may generate first and second cross-block correlation matrices based on the first and second kernels. Specifically, the first auxiliary core 324_1 may generate the first cross-block correlation matrix by correlating a first block correlation matrix, which corresponds to the first kernel, with a second block correlation matrix, which corresponds to the second kernel. The first auxiliary core 324_1 may generate the second cross-block correlation matrix by correlating the second block correlation matrix, which corresponds to the second kernel, with the first block correlation matrix, which corresponds to the first kernel.

In operation S110, the first filter core 322_1 may provide a first past channel estimation result to the first auxiliary core 324_1. Specifically, the first past channel estimation result may be associated with the first kernel and may be an estimation result of an effective channel of an input signal that is received from a signal route by the first filter core 322_1.

In operation S120, the second filter core 322_2 may provide a second past channel estimation result to the first auxiliary core 324_1. Specifically, the second past channel estimation result may be associated with the second kernel and may be an estimation result of an effective channel of an input signal that is received from the signal route by the second filter core 322_2.

In operation S130, the first auxiliary core 324_1 may perform a multiplication calculation based on the first and second cross-block correlation matrices and the first and second past channel estimation results.

In operation S140, the first auxiliary core 324_1 may provide a second multiplication result to the first filter core 322_1. Specifically, the second multiplication result may be generated by multiplying the second cross-block correlation matrix by the second past channel estimation result.

In operation S150, the first auxiliary core 324_1 may provide a first multiplication result to the second filter core 322_2. Specifically, the first multiplication result may be generated by multiplying the first cross-block correlation matrix by the first past channel estimation result.

In operation S160, the first filter core 322_1 may perform a main calculation based on the first kernel and the second multiplication result.

In operation S170, the second filter core 322_2 may perform a main calculation based on the second kernel and the first multiplication result.

Figure 6:
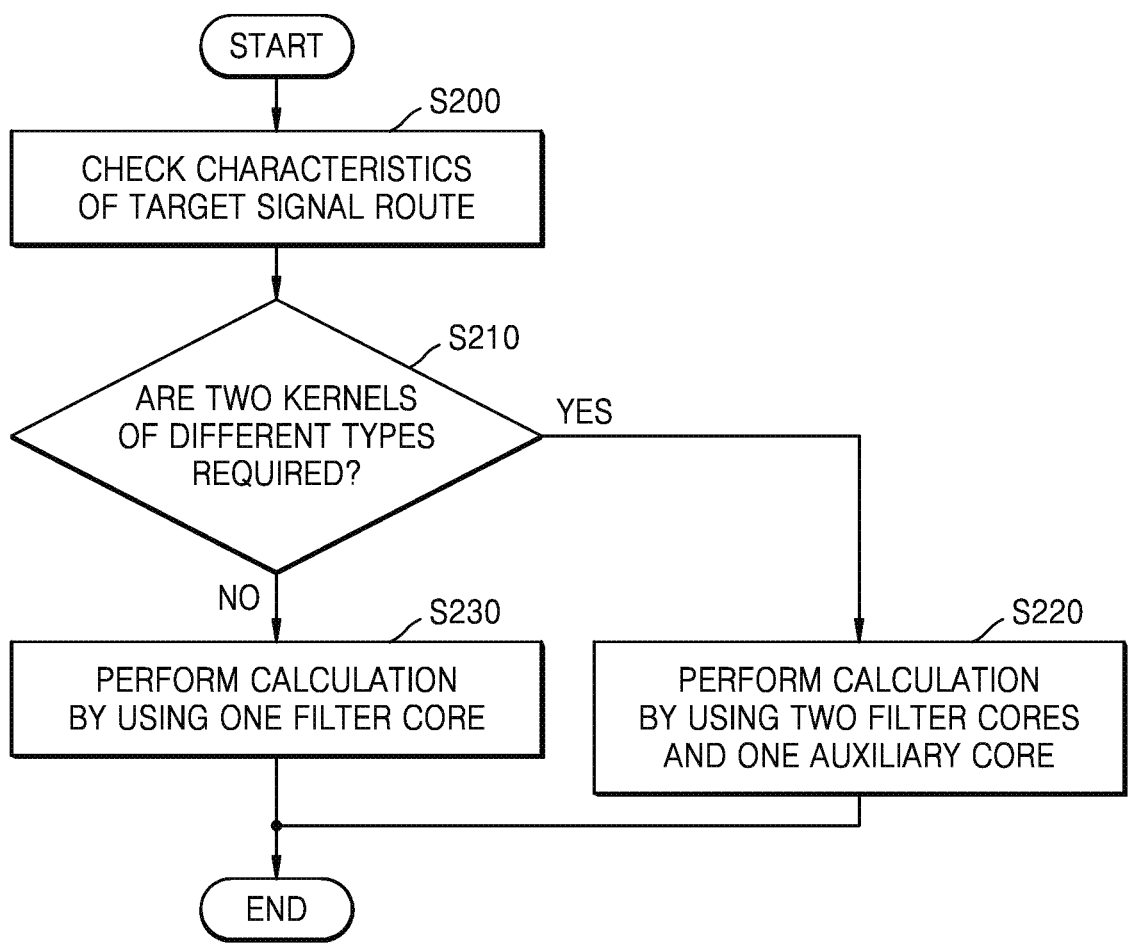
FIG. 6 is a flowchart illustrating operations of an adaptive filter circuit, according to one or more embodiments.

FIG. 6 is a flowchart illustrating operations of an adaptive filter circuit, according to one or more embodiments.

Referring to FIG. 6, in operation S200, the adaptive filter circuit may check characteristics of a target signal route. The characteristics of the target signal route may be related to a kernel predetermined to be used for an adaptive filtering operation on an input signal of the target signal route.

In operation S210, the adaptive filter circuit may determine whether two kernels of different types are required for an adaptive filtering operation on the input signal of the target signal route.

When the result in operation S210 is "YES", operation S220 is subsequent thereto, and thus, the adaptive filter circuit may perform calculations related to the adaptive filtering operation using two filter cores and one auxiliary core.

When the result in operation S210 is "NO", operation S230 is subsequent thereto, and thus, the adaptive filter circuit may perform calculations related to the adaptive filtering operation using one filter core.

Figure 7:
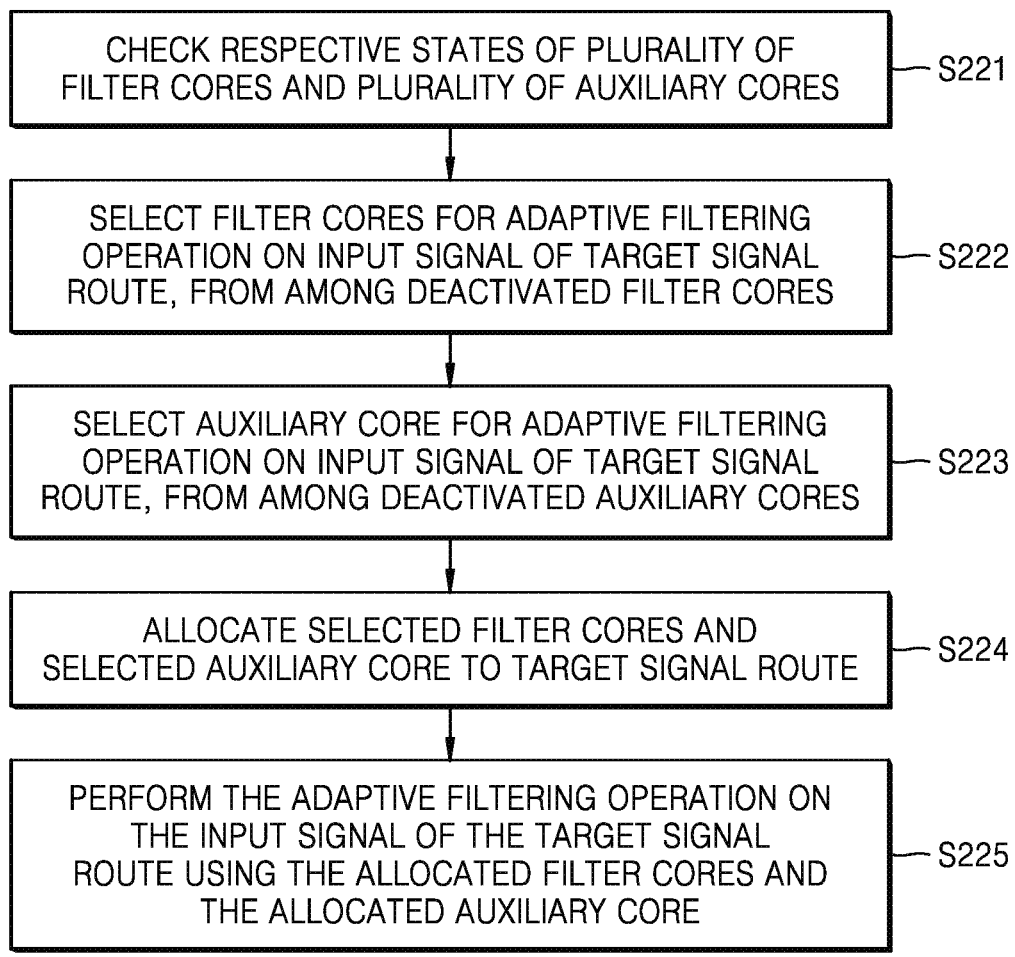
FIG. 7 is a flowchart illustrating a method of operating an adaptive filter circuit, according to one or more embodiments.

FIG. 7 is a flowchart illustrating a method of operating an adaptive filter circuit, according to one or more embodiments.

Referring to FIG. 7, in operation S221, the adaptive filter circuit may check the respective states of a plurality of filter cores and a plurality of auxiliary cores.

In operation S222, the adaptive filter circuit may select filter cores for the adaptive filtering operation on the input signal of the target signal route from among deactivated filter cores (or filter cores in an idle state).

In operation S223, the adaptive filter circuit may select an auxiliary core for the adaptive filtering operation on the input signal of the target signal route from among deactivated auxiliary cores (or auxiliary cores in an idle state).

In operation S224, the adaptive filter circuit may allocate the selected filter cores and the selected auxiliary core to the target signal route.

In operation S225, the adaptive filter circuit may perform the adaptive filtering operation on the input signal of the target signal route using the allocated filter cores and the allocated auxiliary core.

Figure 8:
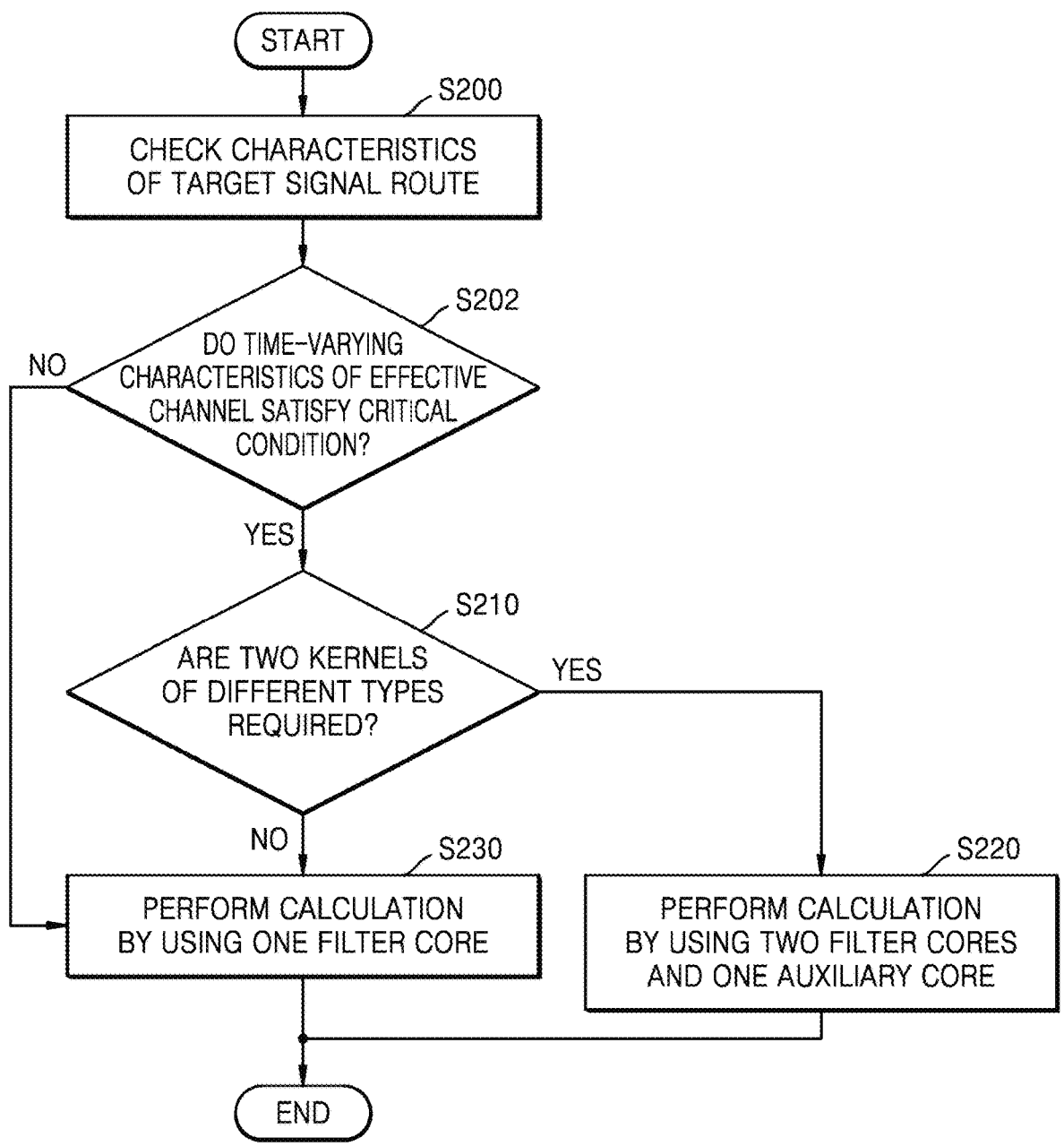
FIG. 8 is a flowchart illustrating a method of operating an adaptive filter circuit, according to one or more embodiments.

FIG. 8 is a flowchart illustrating a method of operating an adaptive filter circuit, according to one or more embodiments. Repeated descriptions given with reference to FIG. 6 may be omitted for convenience.

Referring to FIG. 8, operation S202 may be added between operation S200 and operation S210, as compared with FIG. 6. That is, in operation S202, the adaptive filter circuit may determine whether time-varying characteristics of an effective channel of an input signal of a target signal route satisfy a critical condition.

As described above, because an auxiliary core performs auxiliary calculations using a past channel estimation result of the effective channel of the input signal instead of a current channel estimation result of the effective channel of the input signal, it may be necessary for the time-varying degree of the effective channel to be limited within a certain range. Therefore, the adaptive filter circuit may determine whether the time-varying degree of the effective channel is within a certain range, by various methods, and when the time-varying degree of the effective channel is within the certain range, the adaptive filter circuit may determine that the time-varying characteristics of the effective channel satisfy the critical condition.

When the result in operation S202 is "YES", operation S210 may be subsequent to operation S202, and when the result in operation S202 is "NO", operation S230 may be subsequent to operation S202.

Figure 9:
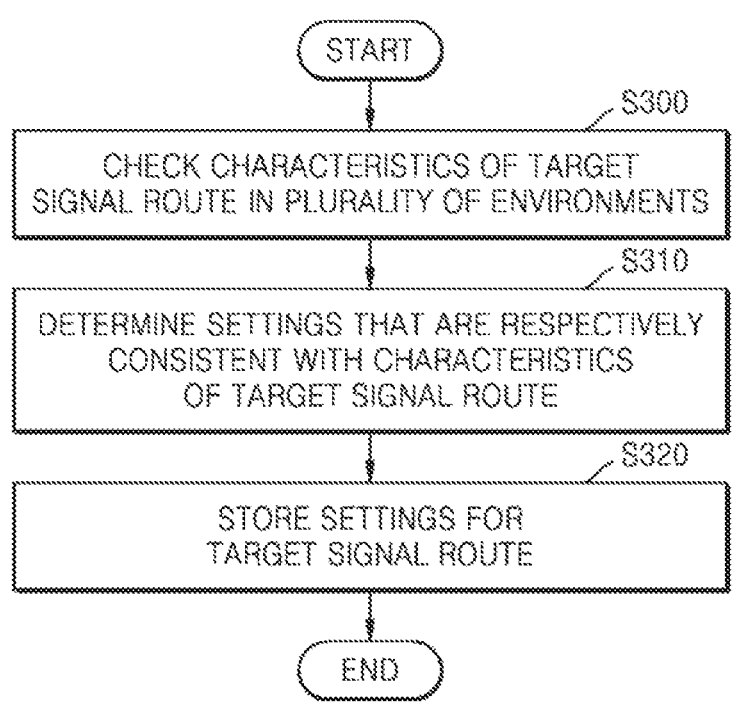
FIG. 9 is a flowchart illustrating a method of operating an adaptive filter circuit, according to one or more embodiments.

FIG. 9 is a flowchart illustrating a method of operating an adaptive filter circuit, according to one or more embodiments.

Referring to FIG. 9, in operation S300, the adaptive filter circuit may check characteristics of a target signal route in a plurality of environments. Environments may be defined as combinations of elements that may affect an input signal of the target signal route, such as an activated or deactivated state of a signal route around the target signal route and the like. The target signal route may operate in one of the plurality of environments.

In operation S310, the adaptive filter circuit may determine settings respectively corresponding to the characteristics of the target signal route. As a specific example, the adaptive filter circuit may determine at least one first kernel in advance for an adaptive filtering operation on the input signal of the target signal route operating in a first environment and may determine at least one second kernel in advance for an adaptive filtering operation on the input signal of the target signal route operating in a second environment.

In operation S320, the adaptive filter circuit may store the settings for the target signal route in a certain memory.

Figure 10:
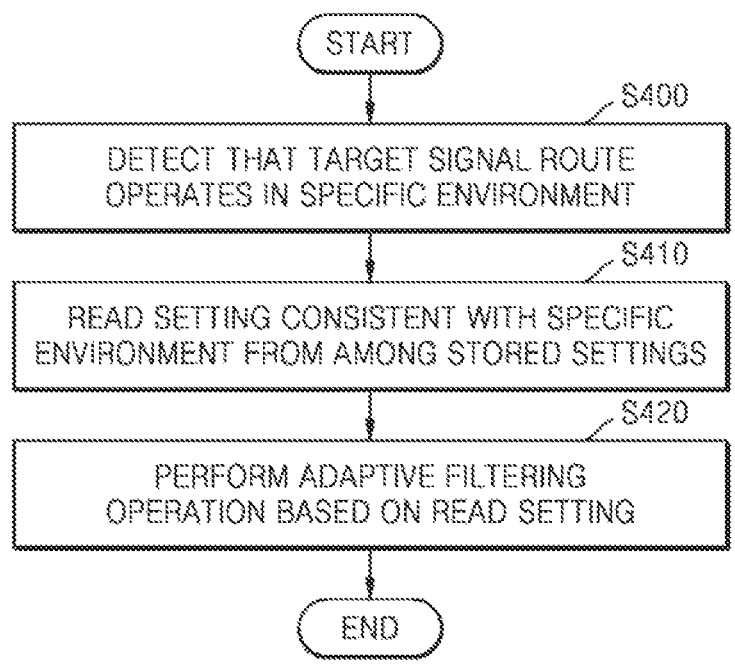
FIG. 10 is a flowchart illustrating a method of operating an adaptive filter circuit, according to one or more embodiments.

FIG. 10 is a flowchart illustrating a method of operating an adaptive filter circuit, according to one or more embodiments.

Referring to FIG. 10, in operation S400, the adaptive filter circuit may detect that a target signal route operates in a specific environment.

In operation S410, the adaptive filter circuit may read a setting corresponding to the specific environment from among the settings stored in operation S310 of FIG. 9.

In operation S420, the adaptive filter circuit may perform an adaptive filtering operation based on the read setting.

Figure 11:
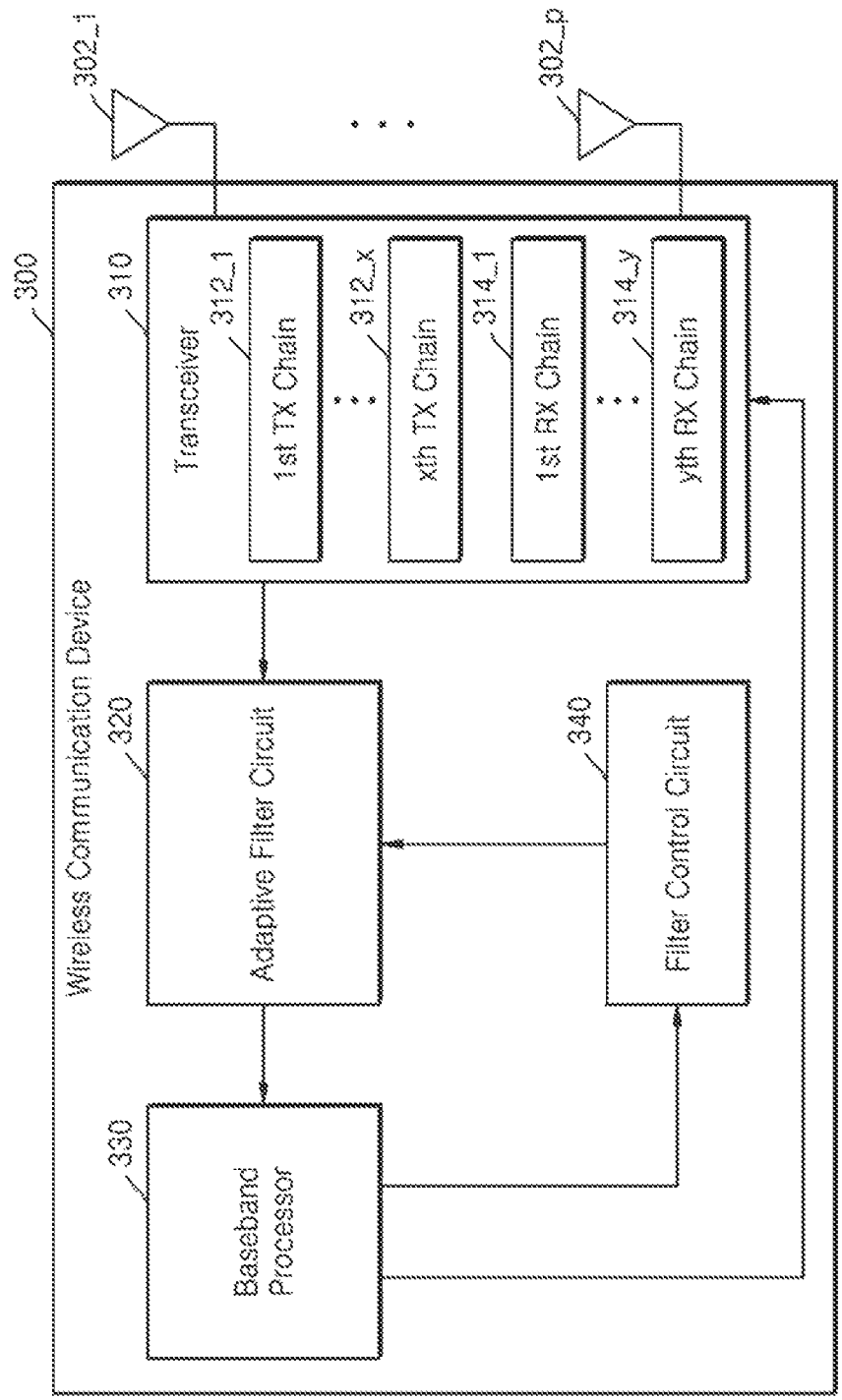
FIG. 11 is a block diagram illustrating a wireless communication device according to an embodiment.

FIG. 11 is a block diagram schematically illustrating a wireless communication device 300 according to one or more embodiments.

Referring to FIG. 11, the wireless communication device 300 may include first to p-th antennas 302_1 to 302_p (where p is an integer of 1 or more), a transceiver 310, an adaptive filter circuit 320, a baseband processor 330, and a filter control circuit 340. In some embodiments, the adaptive filter circuit 320 and the filter control circuit 340 may be integrated into one integrated circuit.

The transceiver 310 may include first to x-th transmission chains 312_1 to 312_x (where x is an integer of 1 or more) and first to y-th reception chains 314_1 to 314_y (where y is an integer of 1 or more). In an embodiment, at least one of the first to y-th reception chains 314_1 to 314_y may be activated and included in a target signal route. In an embodiment, the first to x-th transmission chains 312_1 to 312_x may include a digital-to-analog converter, a mixer for frequency up-conversion, a power amplifier, and the like, and the first to y-th reception chains 314_1 to 314_y may include a low-noise amplifier, a mixer for frequency down-conversion, an analog-to-digital converter, and the like.

In an embodiment, the baseband processor 330 may control the activation/deactivation, the connection with an antenna, and the like of the first to x-th transmission chains 312_1 to 312_x and the first to y-th reception chains 314_1 to 314_y. The baseband processor 330 may provide, to the filter control circuit 340, information indicating at least one reception chain, which is activated, from among the first to y-th reception chains 314_1 to 314_y.

In an embodiment, the filter control circuit 340 may control the adaptive filter circuit 320 based on characteristics of the target signal route including the at least one reception chain that is activated. Specifically, when there are two kernels corresponding to the characteristics of the target signal route, the filter control circuit 340 may allocate two filter cores and one auxiliary core, which are included in the adaptive filter circuit 320, to an adaptive filtering operation on an input signal of the target signal route.

In an embodiment, the adaptive filter circuit 320 may remove interference, which is included in the input signal received from the target signal route, by performing an adaptive filtering operation on the input signal, and then, may provide the input signal, from which the interference is removed, to the baseband processor 330. The baseband processor 330 may process the input signal, from which the interference is removed, and thus may perform data communication.

Figure 12A:
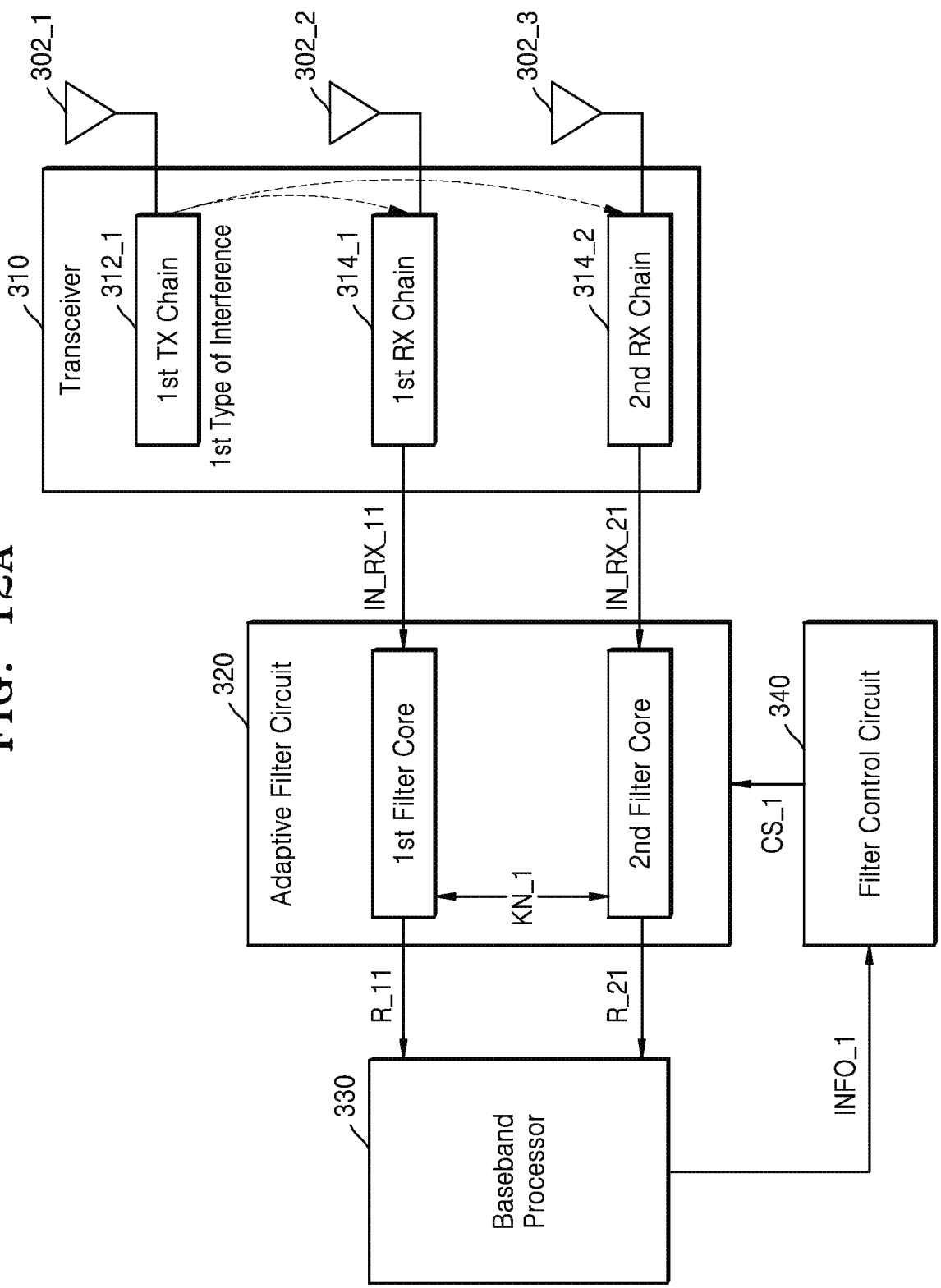
FIGS. 12A and 12B are block diagrams illustrating operations of the wireless communication device of FIG. 11 according to one or more embodiments.
Figure 12B:
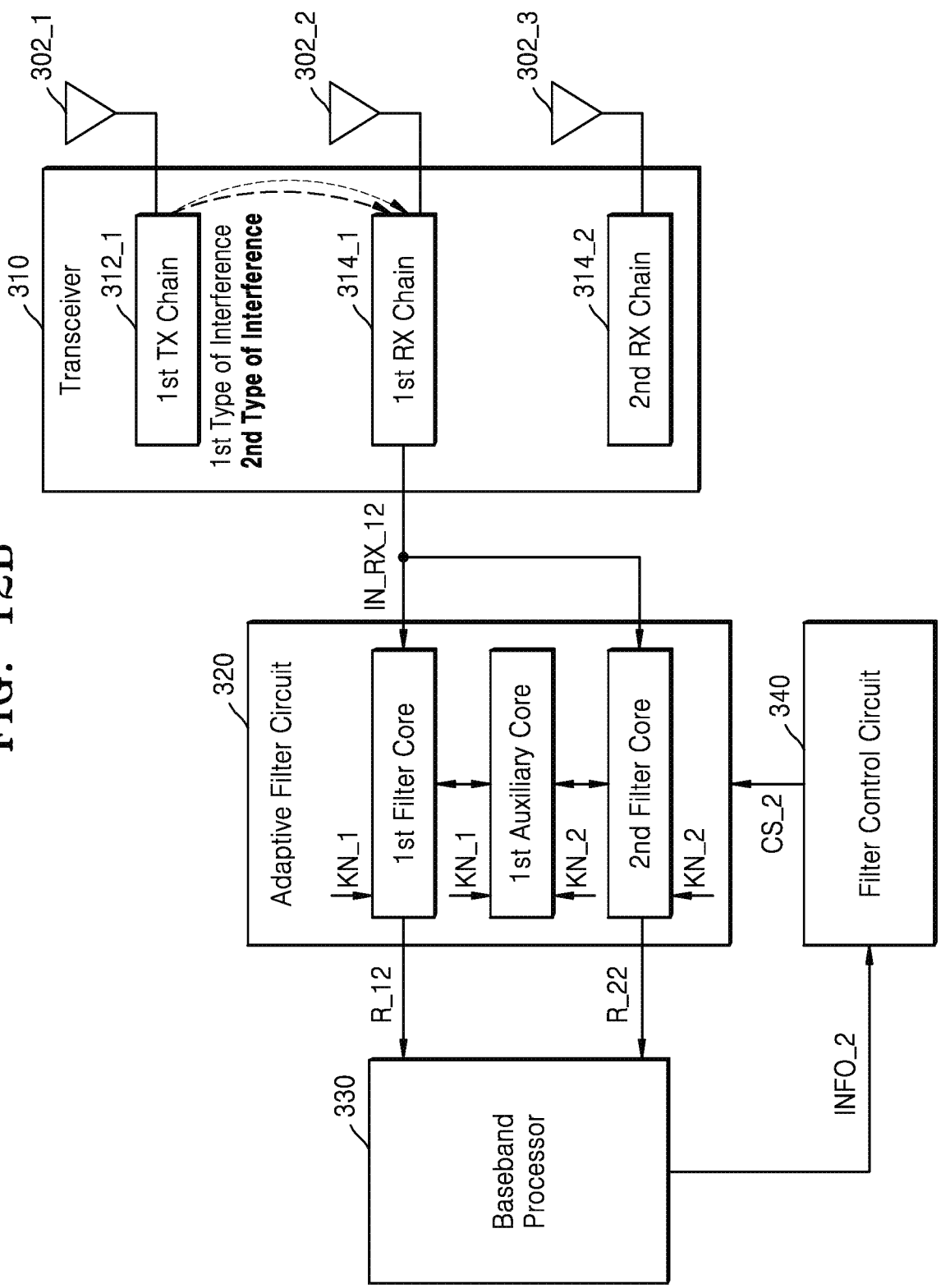

FIGS. 12A and 12B are block diagrams illustrating operations of the wireless communication device 300 of FIG. 11 according to one or more embodiments. Regarding FIGS. 12A and 12B, repeated descriptions given with reference to FIG. 11 may be omitted for convenience.

Referring to FIG. 12A, the first reception chain 314_1 and the second reception chain 314_2 of the transceiver 310 may be activated. The first reception chain 314_1 may be included in a first target signal route and the second reception chain 314_2 may be included in a second target signal route. The first transmission chain 312_1 may be connected with the first antenna 302_1, the first reception chain 302_2 may be connected with the second antenna 302_2, and the second reception chain 302_3 may be connected with the third antenna 302_3.

In an embodiment, a first input signal IN_RX_11 of the first target signal route and a second input signal IN_RX_21 of the second target signal route may each include a first type of interference from the first transmission chain 312_1.

In an embodiment, the baseband processor 330 may provide, to the filter control circuit 340, first information INFO_1 indicating that the first reception chain 314_1 and the second reception chain 314_2 are activated.

In an embodiment, the filter control circuit 340 may check characteristic of the first target signal route and characteristic of the second target signal route, based on the first information INFO_1, and thus may generate a first control signal CS_1. Based on the first control signal CS_1, the adaptive filter circuit 320 may allocate the first filter core 322_1 alone to an adaptive filtering operation on the first input signal IN_RX_11 and allocate the second filter core 322_2 alone to an adaptive filtering operation on the second input signal IN_RX_21.

In an embodiment, the first filter core 322_1 may generate a first filtering result R_11 by performing, alone, the adaptive filtering operation on the first input signal IN_RX_11 based on a first kernel KN_1 and may provide the first filtering result R_11 to the baseband processor 330. The first filtering result R_11 may include a signal obtained by removing interference from the first input signal IN_RX_11.

In an embodiment, the second filter core 322_2 may generate a second filtering result R_21 by performing, by itself, the adaptive filtering operation on the second input signal IN_RX_11 based on the first kernel KN_1 and may provide the second filtering result R_21 to the baseband processor 330. The second filtering result R_21 may include a signal obtained by removing interference from the second input signal IN_RX_21.

Referring further to FIG. 12B, the first reception chain 314_1 of the transceiver 310 may be activated, the second reception chain 314_2 of the transceiver 310 may be deactivated, and the first reception chain 314_1 may be included in the first target signal route.

In an embodiment, a third input signal IN_RX_12 of the first target signal route may include a first type of interference and a second type of interference from the first transmission chain 312_1.

In an embodiment, the baseband processor 330 may provide, to the filter control circuit 340, second information INFO_2 indicating that the first reception chain 314_1 is activated and the second reception chain 314_2 is deactivated.

In an embodiment, the filter control circuit 340 may check the characteristic of the first target signal route, based on the second information INFO_2, and thus may generate a second control signal CS_2. Based on the second control signal CS_2, the adaptive filter circuit 320 may allocate the first filter core 322_1, the second filter core 322_2, and the first auxiliary core 324_1 to an adaptive filtering operation on the third input signal IN_RX_12.

In an embodiment, the first auxiliary core 324_1 may perform an auxiliary calculation operation based on the first kernel KN_1 and the second kernel KN_2 and may provide auxiliary calculation results to the first filter core 322_1 and the second filter core 322_2.

In an embodiment, the first filter core 322_1 may generate a third filtering result R_12 by performing a main calculation operation based on the first kernel KN_1 and the auxiliary calculation result, which is provided by the first auxiliary core 324_1, and may provide the third filtering result R_12 to the baseband processor 330. The third filtering result R_12 may include a signal obtained by removing interference from the third input signal IN_RX_12 based on the first kernel KN_1.

In an embodiment, the second filter core 322_2 may generate a fourth filtering result R_22 by performing a main calculation operation based on the second kernel KN_2 and the auxiliary calculation result, which is provided by the first auxiliary core 324_1, and may provide the fourth filtering result R_22 to the baseband processor 330. The fourth filtering result R_22 may include a signal obtained by removing interference from the third input signal IN_RX_12 based on the second kernel KN_2.

Figure 13:
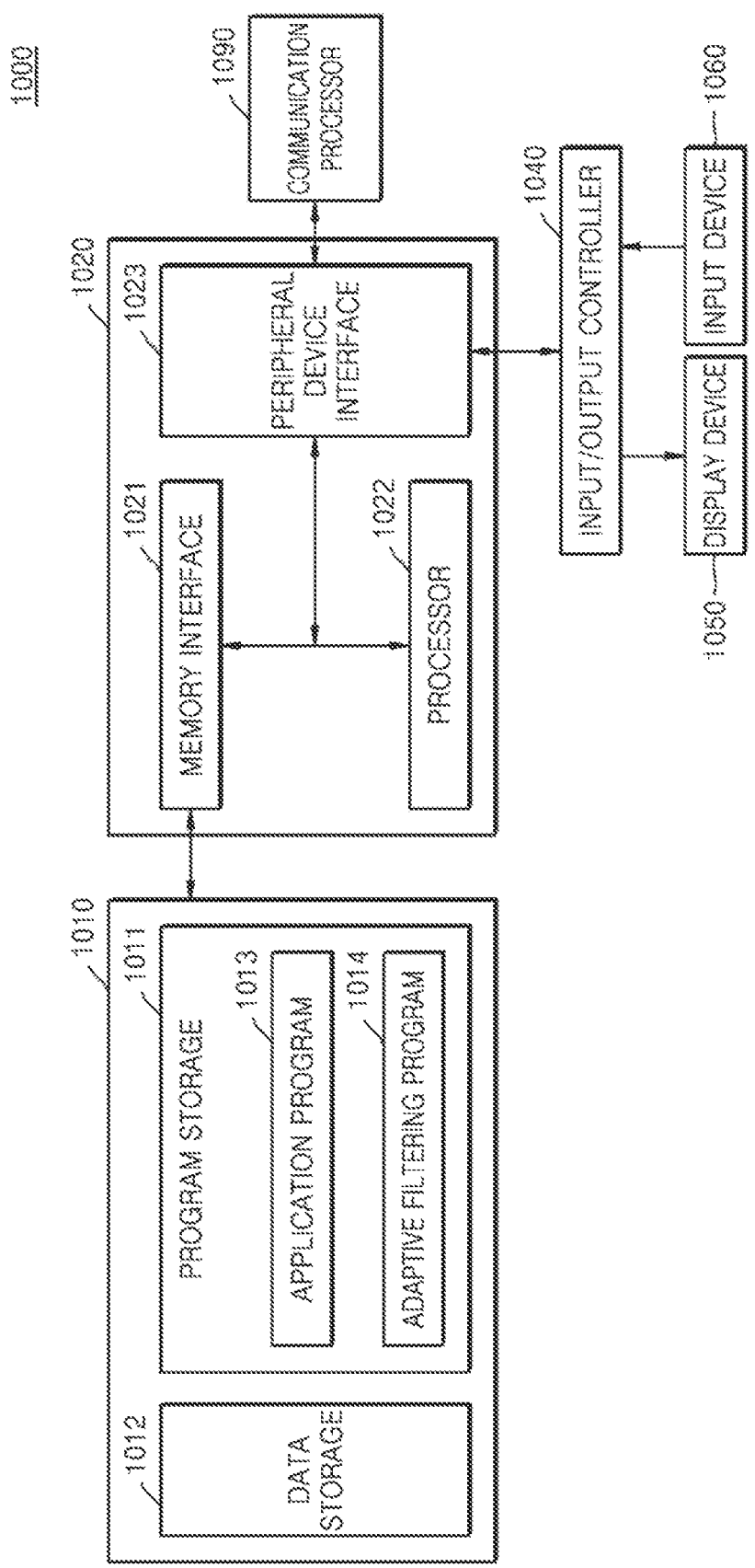
FIG. 13 is a block diagram illustrating an electronic device according to one or more embodiments.

FIG. 13 is a block diagram schematically illustrating an electronic device 1000 according to one or more embodiments.

Referring to FIG. 13, the electronic device 1000 may include a memory 1010, a processing assembly 1020, an input/output controller 1040, a display device 1050, an input device 1060, and a communication processor 1090. The memory 1010 may be provided as a plurality of memories.

The memory 1010 may include a program storage 1011, which may store a program for controlling operations of the electronic device 1000, and a data storage 1012, which may store data generated during the execution of the program. The data storage 1012 may store data required for operations of an application program 1013 and an adaptive filtering program 1014 or may store data generated from the operations of the application program 1013 and the adaptive filtering program 1014.

The program storage 1011 may include the application program 1013 and the adaptive filtering program 1014. A program in the program storage 1011 may be a set of instructions and may be referred to as an instruction set. The application program 1013 may include pieces of program code for performing various applications operating on the electronic device 1000. That is, the application program 1013 may include various pieces of code (or commands) regarding various applications driven by a processor 1022.

The adaptive filtering program 1014 may flexibly allocate a plurality of filter cores and an auxiliary core for an adaptive filtering operation on an input signal of a signal route, based on characteristics of the signal route, according to some embodiments. In addition, the auxiliary core may generate cross-terms based on past channel estimation results of the input signal from the plurality of filter cores and may respectively provide the cross-terms to the filter cores. The filter cores may simplify an equation of an adaptive filtering operation using the cross-terms provided by the auxiliary core and may perform calculations according to the simplified equation.

The electronic device 1000 may include the communication processor 1090, which performs a communication function for voice communication and data communication. A peripheral device interface 1023 may control connections between the input/output controller 1040, the communication processor 1090, the processor 1022, and a memory interface 1021. The processor 1022 may control the electronic device such that a plurality of base stations provide a service corresponding to at least one software program using the at least one software program. The processor 1022 may provide a service corresponding to at least one program by executing the at least one program stored in the memory 1010.

The input/output controller 1040 may provide an interface between input/output devices, such as the display device 1050 and the input device 1060, and the peripheral device interface 1023. The display device 1050 may display state information, a character that is input, a moving picture, a still picture, and the like. For example, the display device 1050 may display information about an application program driven by the processor 1022.

The input device 1060 may provide input data, which is generated by the selection by the electronic device 1000, to the processing assembly 1020 through the input/output controller 1040. The input device 1060 may include a keypad, which includes at least one hardware button, a touchpad, which senses touch information, and the like. For example, the input device 1060 may provide the touch information, such as a touch, a touch motion, a touch release, or the like, which is sensed by the touchpad, to the processor 1022 through the input/output controller 1040.

Figure 14:
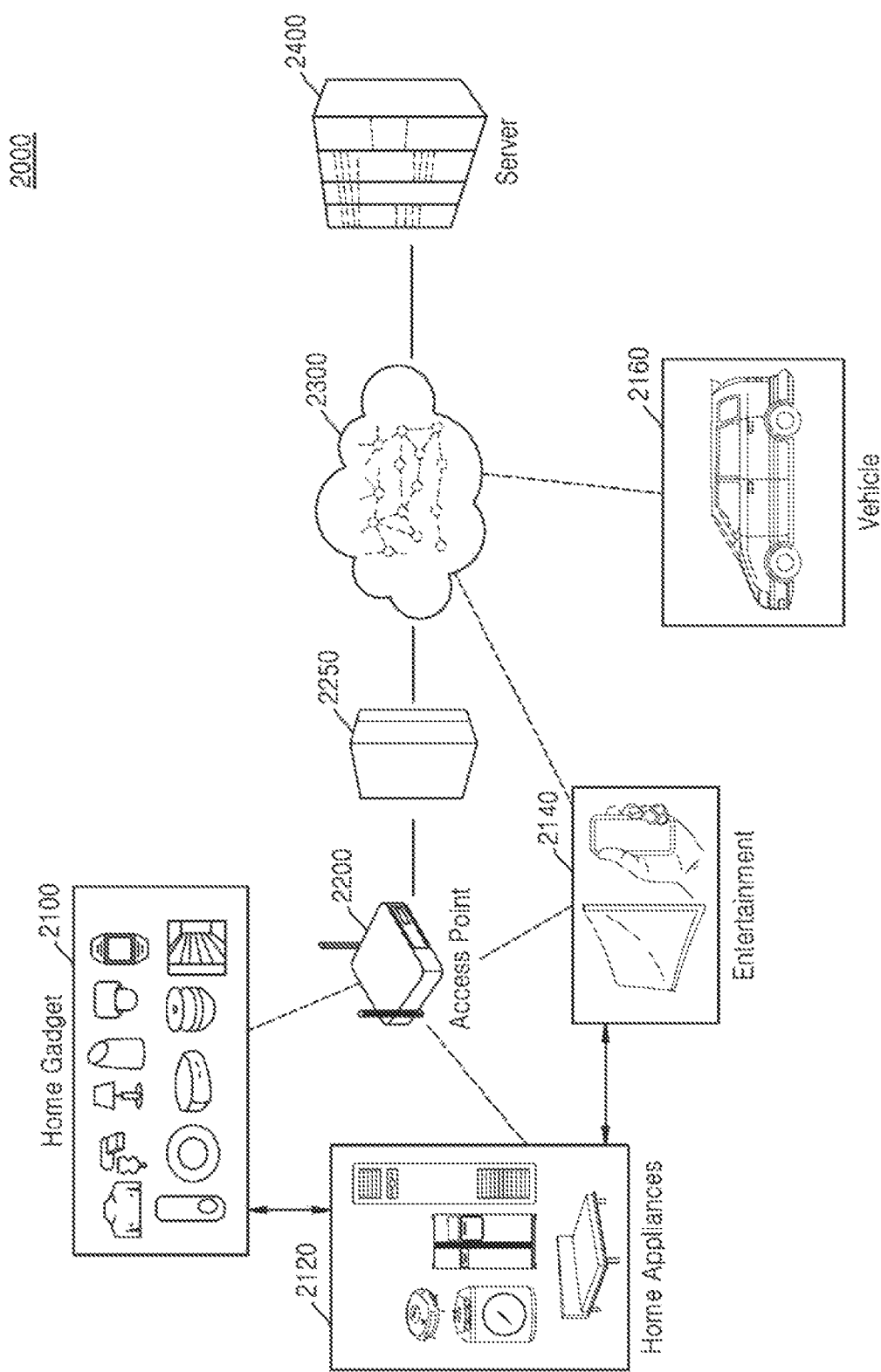
FIG. 14 is a diagram illustrating an Internet-of-Things (IOT) network system according to one or more embodiments.

FIG. 14 is a diagram illustrating an Internet-of-Things (IOT) network system 2000 according to one or more embodiments.

Referring to FIG. 14, the IoT network system 2000 may include IoT devices (that is, 2100, 2120, 2140, and 2160), an access point 2200, a gateway 2250, a wireless network 2300, and a server 2400. IT may refer to a network between things that use wired/wireless communication.

Each of the IoT devices (that is, 2100, 2120, 2140, and 2160) may form a group depending on characteristics of each IoT device. For example, the IoT devices may be grouped into a home gadget group 2100, a home appliance/furniture group 2120, an entertainment group 2140, a vehicle group 2160, or the like. A plurality of IoT devices (that is, 2100, 2120, and 2140) may be connected to a communication network or another IoT device through the access point 2200. The access point 2200 may be embedded in one IoT device. The gateway 2250 may change a protocol such that the access point 2200 is connected to an external wireless network. The IoT devices (that is, 2100, 2120, and 2140) may be connected to an external communication network through the gateway 2250. The wireless network 2300 may include the Internet and/or a public network. A plurality of IoT devices (that is, 2100, 2120, 2140, and 2160) may be connected with the server 2400, which provides a certain service, through the wireless network 2300, and a user may use the service through at least one of the plurality of IoT devices (that is, 2100, 2120, 2140, and 2160).

According to embodiments of the disclosure, the plurality of IoT devices (that is, 2100, 2120, 2140, and 2160) may allocate a plurality of filter cores and an auxiliary core of an adaptive filter circuit to an adaptive filtering operation on an input signal of a signal route, depending on characteristics of the signal route, or may allocate a filter core alone to an adaptive filtering operation on an input signal. In addition, the auxiliary core may perform auxiliary calculations for generating cross-terms, which are used for calculation operations of filter cores associated with each other, and thus may accelerate the calculations of the associated filter cores.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software including one or more instructions that are stored in a storage medium that is readable by a machine. For example, a processor of the machine may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

At least one of the devices, units, components, modules, units, or the like represented by a block or an equivalent indication in the above embodiments including, but not limited to, FIGS. 1, 2A, 2B, 2C, 3, 4A, 4B, 4C, 5, 11, 12A, 12B, 13, and 14 may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

Each of the embodiments provided in the above description is not excluded from being associated with one or more features of another example or another embodiment also provided herein or not provided herein but corresponding to the disclosure.

While the disclosure has been particularly shown and described with reference to embodiments thereof, it will be understood that various changes in form and details may be made therein without departing from the spirit and scope of the following claims.

What is claimed is:

1. An adaptive filter circuit comprising:
   a plurality of filter cores associated with each other and configured to perform a calculation operation on a first target input signal; and
   an auxiliary core configured to:
      generate cross-terms between block correlation matrices respectively corresponding to kernels that correspond to the first target input signal; and
      provide the cross-terms to the plurality of filter cores,
   wherein the plurality of filter cores are further configured to estimate effective channels respectively corresponding to the kernels based on the cross-terms.

2. The adaptive filter circuit of claim 1, wherein the auxiliary core is further configured to generate cross-block correlation matrices respectively from the block correlation matrices; and
   wherein the auxiliary core is configured to generate the cross-terms by multiplying past estimation results of the effective channels by respective cross-block correlation matrices.

3. The adaptive filter circuit of claim 2, wherein the block correlation matrices have respective conjugate transpose relations with the cross-block correlation matrices.

4. The adaptive filter circuit of claim 2, wherein the plurality of filter cores are further configured to:
   generate the past estimation results of the effective channels; and
   provide the past estimation results to the auxiliary core.

5. The adaptive filter circuit of claim 1, wherein the plurality of filter cores are further configured to:
   generate adjusted input vectors by subtracting respective input vectors from the cross-terms, the respective input vectors corresponding to the first target input signal; and
   estimate the effective channels based on the adjusted input vectors and the block correlation matrices.

6. The adaptive filter circuit of claim 1, wherein each of the plurality of filter cores correspond to a recursive least-squares (RLS) filter.

7. The adaptive filter circuit of claim 1, wherein each of the plurality of filter cores is configured to perform the calculation operation based on an operation state of each of the plurality of filter cores.

8. The adaptive filter circuit of claim 1, wherein the first target input signal is received from a first signal route, and
   wherein the kernels comprise a first kernel and a second kernel corresponding to characteristics of the first signal route.

9. The adaptive filter circuit of claim 1, wherein at least one of the plurality of filter cores is configured to:
   estimate an effective channel of a second target input signal received from a second signal route based on a kernel corresponding to characteristics of the second target input signal.

10. The adaptive filter circuit of claim 1, further comprising a connection circuit configured to control connections between the plurality of filter cores and the auxiliary core.

11. The adaptive filter circuit of claim 1, wherein a hardware size of the auxiliary core is less than a hardware size of at least one of the plurality of filter cores.

12. A method of operating an adaptive filter circuit comprising a first filter core, a second filter core, and an auxiliary core, the method comprising:
    receiving a first target input signal from a first signal route;
    generating, by the auxiliary core, a first cross-term and a second cross-term between a first block correlation matrix corresponding to a first kernel and a second block correlation matrix corresponding to a second kernel;
    estimating, by the first filter core, a first effective channel of the first target input signal and corresponding to the first kernel by subtracting the second cross-term from a first input vector corresponding to the first target input signal; and
    estimating, by the second filter core, a second effective channel of the first target input signal and corresponding to the second kernel by subtracting the first cross-term from a second input vector corresponding to the first target input signal.

13. The method of claim 12, wherein the first kernel and the second kernel correspond to characteristics of the first signal route.

14. The method of claim 12, wherein the generating of the first cross-term and the second cross-term comprises:
    generating, by the auxiliary core, a first cross-block correlation matrix from the first block correlation matrix;
    generating, by the auxiliary core, a second cross-block correlation matrix from the second block correlation matrix;
    generating, by the auxiliary core, the second cross-term by multiplying a first past estimation result of the first effective channel by the first cross-block correlation matrix; and
    generating, by the auxiliary core, the first cross-term by multiplying a second past estimation result of the second effective channel by the second cross-block correlation matrix.

15. The method of claim 14, wherein the first past estimation result of the first effective channel is generated by the first filter core, and
    wherein the second past estimation result of the second effective channel is generated by the second filter core.

16. The method of claim 12, further comprising:
- receiving a second target input signal from a second signal route; and
- estimating, by the first filter core, a third effective channel of the second target input signal, based on an input vector corresponding to the second target input signal and a third block correlation matrix corresponding to a third kernel.

17. The method of claim 16, wherein the auxiliary core is deactivated in the estimating of the third effective channel.

18. The method of claim 12, further comprising, based on characteristics of the first signal route:
- allocating the first filter core and the second filter core from among a plurality of filter cores to an adaptive filtering operation on the first target input signal; and
- allocating the auxiliary core from among a plurality of auxiliary cores to the adaptive filtering operation on the first target input signal.

19. A wireless communication device comprising:
- a transceiver comprising a plurality of transmission chains and a plurality of reception chains;
- an adaptive filter circuit comprising filter cores and an auxiliary core configured to remove interference due to at least one of the plurality of transmission chains from a target input signal received through a signal route comprising at least one of the plurality of reception chains; and
- a baseband processor configured to process the target input signal from which the interference is removed by the adaptive filter circuit,
- wherein the auxiliary core is configured to generate cross-terms between block correlation matrices corresponding to kernels that correspond to characteristics of the signal route, and
- wherein the filter cores are configured to remove the interference from the target input signal by estimating effective channels corresponding to the kernels based on the cross-terms.

20. The wireless communication device of claim 19, further comprising a filter control circuit configured to control the adaptive filter circuit to cause the filter cores and the auxiliary core to remove the interference from the target input signal, based on the characteristics of the signal route.

* * * * *